United States Patent
Hsu et al.

(10) Patent No.: US 10,867,963 B2
(45) Date of Patent: Dec. 15, 2020

(54) DIE STACK STRUCTURE AND METHOD OF FABRICATING THE SAME

(71) Applicant: Taiwan Semiconductor Manufacturing Co., Ltd., Hsinchu (TW)

(72) Inventors: Chia-Hao Hsu, Hsinchu (TW); Chien-Ming Chiu, Hsinchu (TW); Yung-Chi Lin, New Taipei (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 16/354,159

(22) Filed: Mar. 14, 2019

(65) Prior Publication Data

US 2020/0294965 A1  Sep. 17, 2020

(51) Int. Cl.
*H01L 23/12* (2006.01)
*H01L 25/065* (2006.01)
*H01L 25/00* (2006.01)

(52) U.S. Cl.
CPC .......... *H01L 25/0652* (2013.01); *H01L 25/50* (2013.01); *H01L 2225/06544* (2013.01); *H01L 2225/06579* (2013.01); *H01L 2225/06586* (2013.01)

(58) Field of Classification Search
CPC ............. H01L 25/0652; H01L 25/0657; H01L 2225/06544; H01L 2225/06579

USPC ......................................... 257/735, 686, 777
See application file for complete search history.

(56) References Cited

U.S. PATENT DOCUMENTS

| | | | | |
|---|---|---|---|---|
| 5,404,044 A | * | 4/1995 | Booth | H01L 23/49827 257/686 |
| 6,087,719 A | * | 7/2000 | Tsunashima | H01L 21/76898 250/548 |
| 6,577,013 B1 | * | 6/2003 | Glenn | H01L 23/3114 257/777 |
| 8,796,822 B2 | * | 8/2014 | Pelley | H01L 21/76898 257/621 |

(Continued)

*Primary Examiner* — Nitin Parekh
(74) *Attorney, Agent, or Firm* — JCIPRNET

(57) ABSTRACT

A die stack structure includes a first die, a dielectric material layer, a first bonding dielectric layer and a second die. The first die has an active surface and a rear surface opposite to the active surface. The first die includes a through-substrate via (TSV) therein. The TSV protrudes from the rear surface of the first die. The dielectric material layer surrounds and wraps around the first die. The first bonding dielectric layer is disposed on a top surface of the dielectric material layer and the rear surface of the first die and covers the TSV, wherein the TSV penetrates through the first bonding dielectric layer. The second die is disposed on the first die and has an active surface and a rear surface opposite to the active surface. The second die has a second bonding dielectric layer and a conductive feature disposed in the second bonding dielectric layer. The first bonding dielectric layer separates the second bonding dielectric layer from the dielectric material layer, and the first die and the second die are bonded through bonding the second bonding dielectric layer with the first bonding dielectric layer and bonding the conductive feature with the TSV.

14 Claims, 21 Drawing Sheets

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2007/0035033 A1* | 2/2007 | Ozguz ............... H01L 23/49827 257/777 |
| 2009/0302435 A1* | 12/2009 | Pagaila ................ H01L 21/561 257/659 |
| 2010/0261311 A1* | 10/2010 | Tsuji ................... H01L 23/3128 438/109 |
| 2012/0028412 A1* | 2/2012 | Jeong ................. H01L 25/0657 438/107 |
| 2012/0074585 A1* | 3/2012 | Koo ................. H01L 23/49827 257/774 |
| 2013/0037944 A1* | 2/2013 | Lee .................... H01L 25/0657 257/737 |
| 2019/0385982 A1* | 12/2019 | Lee ........................ H01L 24/32 |

\* cited by examiner

DIE STACK STRUCTURE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Exemplary types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
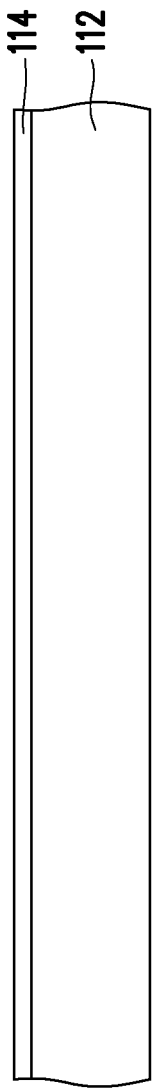
FIG. 1A to FIG. 1K are schematic cross-sectional views illustrating a manufacturing process of a die stack structure and a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a manufacturing process of a die stack structure and a package in accordance with some embodiments of the disclosure. In exemplary embodiments, the manufacturing method is part of a wafer level packaging process. In some embodiments, one die is shown to represent plural dies of the wafer, and one die stack structure 1 is shown to represent plural die stack structures obtained following the manufacturing method.

Referring to FIG. 1A, in some embodiments, a carrier 112 with a buffer layer 114 coated thereon is provided. In some embodiment, the carrier 112 may be a glass carrier or any suitable carrier for carrying a semiconductor wafer for the manufacturing method of the die stack structure and the package. In some embodiments, the buffer layer 114 is disposed over the carrier 112. In some embodiments, the buffer layer 114 may be a dielectric material layer. In some embodiments, the buffer layer 114 may be a polymer layer which is made of polyimide, polybenzoxazole (PBO), benzocyclobutene (BCB), or any other suitable polymer-based dielectric material. In some embodiments, the buffer layer 114 may be Ajinomoto Buildup Film (ABF), Solder Resist film (SR), or the like. The top surface of the buffer layer 114 may be levelled and may have a high degree of coplanarity.

In some embodiments, a debond layer (not shown) is formed between the carrier 112 and the buffer layer 114. In some embodiments, the debond layer is disposed on the carrier 112, and the material of the debond layer may be any material suitable for bonding and debonding the carrier 112 from the above layer(s) (e.g. the buffer layer 114) or any wafer(s) disposed thereon. In some embodiments, the debond layer may include a release layer (such as a light-to-heat conversion ("LTHC") layer) or an adhesive layer (such as a ultra-violet curable adhesive or a heat curable adhesive layer).

Figure 1B:
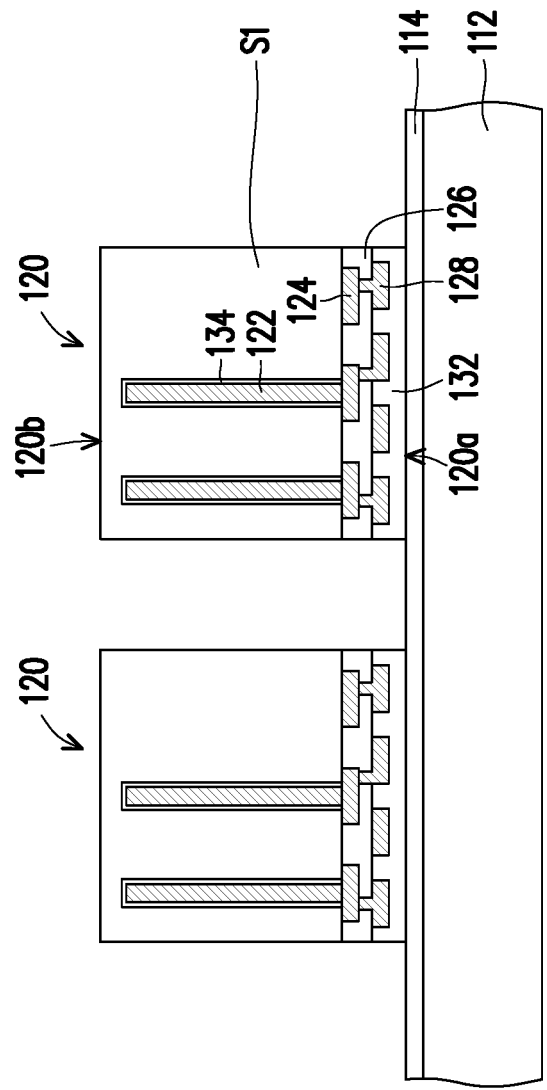

Referring to FIG. 1B, in some embodiments, at least one first die 120 is provided over the carrier 112. In some embodiments, as shown in FIG. 1B, the number of the at least one first die 120 is two. In alternative embodiments, the number of the at least one first die 120 may be one, two or more than two, but the disclosure is not limited thereto. In some embodiments, the first dies 120 may have the same function or different functions. In some embodiments, the first die 120 includes a memory chip such as a high bandwidth memory chip, a dynamic random access memory (DRAM) chip or a static random access memory (SRAM) chip. In some alternative embodiments, the first die 120 may include an application-specific integrated circuit (ASIC) chip, an analog chip, a sensor chip, a wireless application chip such as a Bluetooth chip and a radio frequency chip or a voltage regulator chip.

In some embodiments, each of the first dies 120 has an active surface 120a and a rear surface 120b opposite to the active surface 120a. In some embodiments, the active surface 120a faces toward the carrier 112, while the rear surface 120b faces upward. In detail, each of the first dies 120 includes a semiconductor substrate S1, at least one first through-substrate via (TSV) 122, conductive pads 124, a dielectric layer 126, metal wirings 128 and a passivation layer 132. In some embodiments, the at least one first TSV 122 is formed in the semiconductor substrate S1 before forming the conductive pads 124. In some embodiments, the conductive pads 124 are formed over the semiconductor substrate S1 and some of the conductive pads 124 are electrically connected to the first TSVs 122. The dielectric layer 126 is formed over the conductive pads 124 and partially covers the conductive pads 124. The metal wirings 128 penetrating through the dielectric layer 126 are formed over the dielectric layer 126 and physically and electrically connected to the conductive pads 124. Then, the passivation layer 132 is formed on the dielectric layer 126 and covers the metal wirings 128.

In some embodiments, the semiconductor substrate S1 may be a silicon substrate including active components (e.g., transistors or the like) and/or passive components (e.g., resistors, capacitors, inductors, or the like) formed therein. The conductive pads 124 may be aluminum pads, copper pads, or other suitable metallic pads. In some embodiments, the dielectric layer 126 and/or the passivation layer 132 may be a polybenzoxazole (PBO) layer, a polyimide (PI) layer or other suitable polymers. In some alternative embodiments, the dielectric layer 126 and/or the passivation layer 132 may be made of inorganic materials, such as silicon oxide, silicon nitride, silicon oxynitride, or any suitable dielectric material. In certain embodiments, the materials of the dielectric layer 126 and/or the passivation layer 132 may be the same or different, the disclosure is not limited thereto. In some embodiments, the material of the metal wirings 128 may include aluminum, titanium, copper, nickel, tungsten, and/or alloys thereof. In some embodiments, the dielectric layer 126 and the metal wirings 128 may serve as a under bump metallurgy (UBM) structure for later to be formed bumps or connectors or to provide a routing function for the package. The number of the dielectric layers or the metal wirings is not limited by the disclosure.

As shown in FIG. 1B, in some embodiments, the first dies 120 are attached to the carrier 112 through the buffer layer 114.

In some embodiments, the amount of the first TSV 122 may be one or more than one TSVs, and the first TSVs 122 may be arranged in lines, columns or arrays. In some embodiments, the TSVs may be formed subsequent to the formation of the active components such as transistors. In some embodiments, the TSVs may be formed prior to the formation of the active components such as transistors. In some embodiments, the provided first die 120 includes an isolation liner layer 134 between the semiconductor substrate S1 and the first TSVs 122. As shown in FIG. 1B, the first TSVs 122 are embedded in the semiconductor substrate S1, and the isolation liner layer 134 surrounds each of the first TSVs 122 and covers a top surface and the sidewall of each of the first TSVs 122. It is noted that, since the active surface 120a of the first die 120 faces toward the carrier 112 and the rear surface 120b of the first die 120 faces upward, the surface of the first TSV 122 closest to the rear surface 120b is referred to as a "top surface" of the first TSV 122. In some embodiments, the first TSVs 122 do not penetrate through the semiconductor substrate S1 at the beginning, and the top surfaces of the first TSVs 122 are still covered by the semiconductor substrate S1.

In some embodiments, the formation of the TSVs includes forming via openings in the semiconductor substrate S1 by deep trench forming processes, depositing an isolation liner material over the semiconductor substrate S1 and conformal to the profile of the via openings, and forming a conductive metal/metallic material filling the via openings. The formation of the TSVs may further includes performing a planarization process to remove extra metal material and isolation liner material outside the via openings, and optionally forming a barrier layer prior to the filling of the metal/metallic material. For example, the via openings in the semiconductor substrate S1 are formed by, for example, etching (such as reactive ion etch or deep silicon etch), milling, laser drilling, or a combination thereof. Then, the isolation liner material is formed over the semiconductor substrate S1 and conformally covering the sidewalls of the via openings by thermal oxidation, chemical vapor deposition (CVD), atomic layer deposition (ALD), physical vapor deposition (PVD), combinations thereof, or the like. Subsequently, the first TSVs 122 and the isolation liner layer 134 are formed in the via openings by depositing a conductive metal material over the isolation liner material and filling into the via openings and then performing a planarization process to remove extra conductive metal material and isolation liner material outside the via openings. The conductive metal material may be formed by an electro-chemical plating process, CVD, ALD, PVD, combinations thereof, or the like. In some embodiments, the first TSVs 122 may include copper, copper alloys, aluminum, aluminum alloys, tungsten, or combinations thereof. In some embodiments, the material of the isolation liner layer 134 may include silicon oxide, silicon nitride, a polymeric material or a combination thereof. In some alternative embodiments, a thin barrier layer (not shown) may be formed between the isolation liner layer 134 and the first TSVs 122. The barrier layer may be formed from a nitride or an oxynitride, such as titanium nitride, titanium oxynitride, tantalum nitride, tantalum oxynitride, tungsten nitride, combinations thereof, or the like.

Figure 1C:
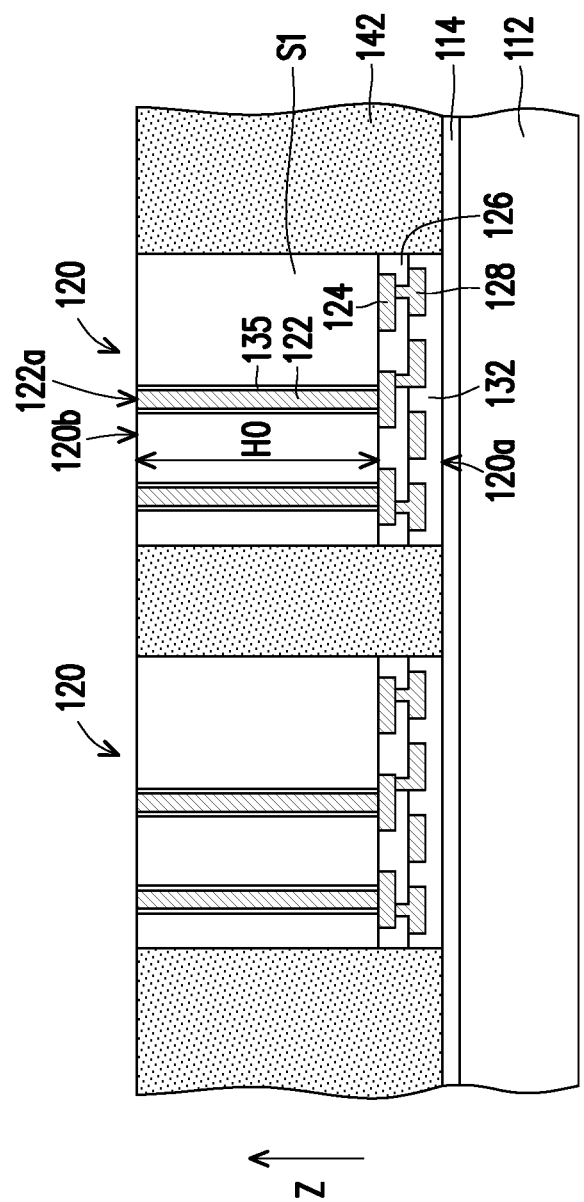

Referring to FIG. 1C, in some embodiments, a dielectric material (not shown) is formed over the carrier 112 and the first dies 120. In some embodiments, the dielectric material may be formed by deposition, such as CVD or the like. In some embodiments, the dielectric material covers the first dies 120, where the first dies 120 are not accessibly revealed by the dielectric material. Then, a planarization process is performed to remove the dielectric material and the semiconductor substrates S1 of the first dies 120 until the top surfaces 122a of the first TSVs 122 are exposed to form a dielectric material wrap 142. In some embodiments, during the planarization process, the dielectric material, the isolation liner layer 134 on the top surfaces 122a of the first TSVs 122 and semiconductor substrates S1 of the first dies 120 are polished or grinded until the top surfaces 122a of the first TSVs 122 are exposed. In some embodiments, the dielectric material is partially removed to form the dielectric material wrap 142 over the carrier 112 and surrounding the first dies 120, while the semiconductor substrates S1 of the first dies 120 and the isolation liner layers 134 above the first TSVs 122 are removed to expose the first TSVs 122. In some embodiments, through the planarization process, the isolation liner layer 134 is partially removed to expose the top surface 122a of the first TSV 122 and form an isolation liner sheath 135 surrounding the sidewall of each first TSV 122. After the planarization process, the first TSVs 122 and the isolation liner sheaths 135 have substantially the same height H0 (in the thickness direction Z). In some embodiments, the planarization process includes performing a mechanical grinding process, a chemical mechanical polishing (CMP) process or the combination thereof. After the polishing or grinding step, a cleaning step may be optionally performed to clean and remove the residues generated from the grinding or polishing step. However, the disclosure is not limited thereto, and the planarization process may be performed through any other suitable method. In some embodiments, portions of the first TSVs 122 are also slightly grinded during the planarization process.

As shown in FIG. 1C, the dielectric material wrap 142 laterally encloses the first dies 120. In some embodiments, the first dies 120 are embedded in the dielectric material wrap 142, but the rear surfaces 120b of the first dies 120 and the top surface 122a of the first TSVs 122 are exposed. In some embodiments, through the planarization, the rear surfaces 120b of the first dies 120 and the top surfaces 122a of the first TSVs 122 become substantially levelled with the top surface of the dielectric material wrap 142. In other words, the rear surfaces 120b of the first dies 120 and the top surfaces 122a of the first TSVs 122 are coplanar with the top surface of the dielectric material wrap 142. In some embodiments, the material of the dielectric material wrap 142 may include silicon oxide, silicon nitride, a polymeric material or a combination thereof.

Figure 1D:
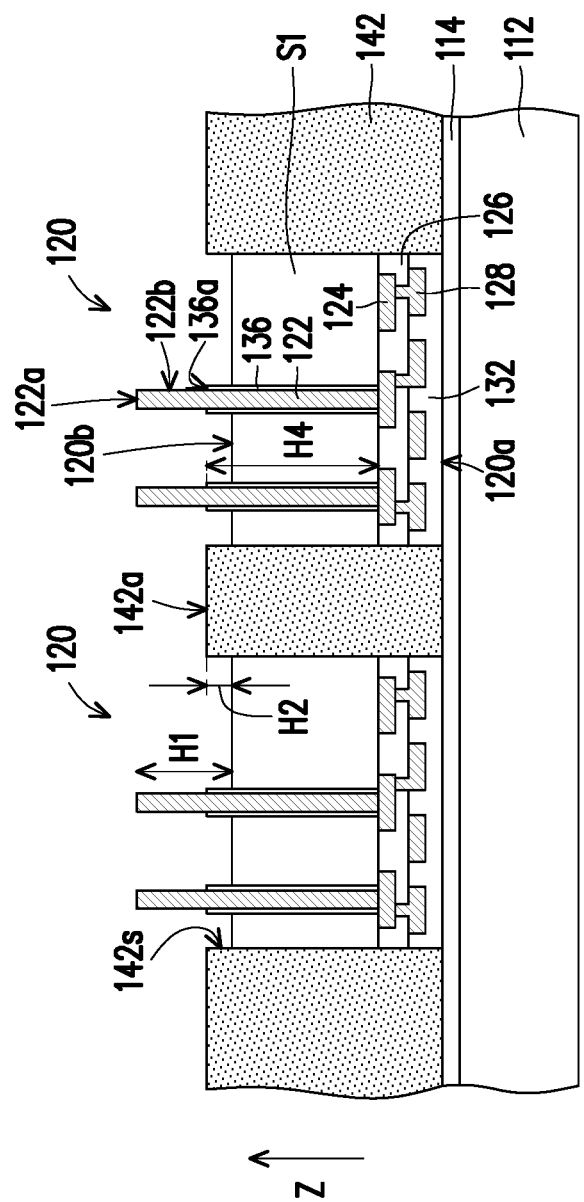

Referring to FIG. 1D, in some embodiments, a recessing process is performed to remove portions of the semiconductor substrates S1 of the first dies 120 and a portion of the dielectric material wrap 142, such that top surfaces 122a and upper sidewalls 122b of the first TSVs 122 are exposed. In other words, the first TSV 122 penetrates through the semiconductor substrate S1, protrudes from the rear surface 120b of the first die 120 and is projected to be higher than the top surface 142a of the dielectric material wrap 142. In some embodiments, the semiconductor substrates S1 and the dielectric material wrap 142 are recessed by performing a dry etching process. In some embodiments, the semiconductor substrates S1 and the dielectric material wrap 142 are recessed by the same dry etching process, while the first TSVs 122 are not recessed by the same dry etching process. In some embodiments, in the same dry etching process, the isolation liner sheaths 135 are recessed along with the dielectric material wrap 142, while the first TSVs 122 are not recessed by the same dry etching process.

In some embodiments, in the same etching process, the etching rate (removal rate) of the semiconductor substrates S1 is higher than the etching rate (removal rate) of the dielectric material wrap 142, so that the semiconductor substrates S1 are recessed more than the dielectric material wrap 142. That is, the top surface 142a of the dielectric material wrap 142 is higher than the rear surfaces 120b of the first dies 120, and certain portions 142s of sidewalls of the dielectric material wrap 142 are exposed. In some embodiments, as shown in FIG. 1D, there is a height difference H1 (in the thickness direction Z) between the rear surface 120b of the first die 120 and the top surface 122a of the first TSV 122, and the height difference H1 is, for example, about 7 kA. In some embodiments, after performing the recessing process, the rear surfaces 120b of the first dies 120 are lower than the top surface 142a of the dielectric material wrap 142 due to etching selectivity. In some embodiments, there is a height difference H2 (or so-called "step height" in the thickness direction Z) between the top surface 142a of the dielectric material wrap 142 and the rear surface 120b of the first die 120, and the height difference H2 is, for example, about 1 kA. A smaller step height is favorable to provide an evener and flatter surface for the subsequently formed bonding layer. However, the height difference may be changed depending on the materials of the dielectric material wrap and the isolation liner sheath and applied etching process parameters or recipes, and the disclosure is not limited to the exemplary embodiments herein. In some alternative embodiments, in the same etching process, the etching rate (removal rate) of the semiconductor substrates S1 is lower than the etching rate (removal rate) of the dielectric material wrap 142, so that the semiconductor substrates S1 is recessed less than the dielectric material wrap 142. That is, the top surface 142a of the dielectric material wrap 142 is lower than the rear surfaces 120b of the first dies 120.

As shown in FIG. 1D, after performing the recessing process, portions of the isolation liner sheaths 135 are also removed to form the recessed isolation liner sheaths 136. That is, the sidewall of the first TSV 122 is not fully covered by the recessed isolation liner sheath 136. In some embodiments, the isolation liner sheath 135 and the dielectric material wrap 142 are made of the same material. In some embodiments, in the same etching process, the etching rate (removal rate) of the isolation liner sheaths 135 is about the same as the etching rate (removal rate) of the dielectric material wrap 142, so that the dielectric material wrap 142 and the isolation liner sheath 135 are recessed with the same depth. In one embodiment, in the thickness direction Z, topmost ends 136a of the recessed isolation liner sheaths 136 are substantially levelled with and at substantially the same height H4 as the top surface 142a of the dielectric material wrap 142 after the recessing process.

In some alternative embodiments, the isolation liner sheaths 135 and the dielectric material wrap 142 are made of different materials. In one embodiment, the recessed isolation liner sheaths 136 are still protruded from the semiconductor substrate S1 but slightly lower or higher than the top surface 142a of the dielectric material wrap 142 after the recessing process.

Figure 1E:
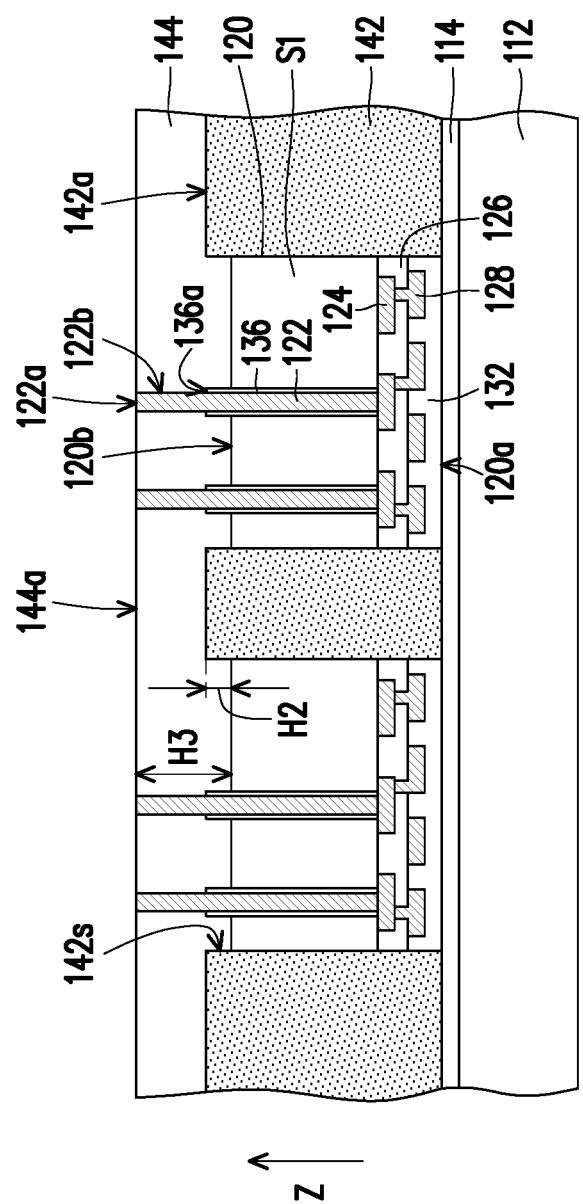

Referring to FIG. 1E, in some embodiments, a first bonding dielectric layer 144 is formed to cover the rear surfaces 120b of the first dies 120 and the top surface 142a of the dielectric material wrap 142. In some embodiments, a bonding dielectric material (not shown) is formed over the rear surfaces 120b of the first dies 120 and the top surface 142a of the dielectric material wrap 142, and the bonding dielectric material may be formed by deposition, such as CVD or the like. Then, a planarization process is performed to planarize the bonding dielectric material to form the first bonding dielectric layer 144. In some embodiments, the bonding dielectric material is partially removed through polishing or grinding until the top surfaces 122a of the first TSVs 122 are exposed. After the planarization process, the first bonding dielectric layer 144 covers the rear surfaces 120b of the first dies 120, the upper sidewalls 122b of the first TSVs 122, the topmost ends 136a of the recessed isolation liner sheaths 136, and the top surface 142a and portions 142s of the sidewalls of the dielectric material wrap 142. In some embodiments, the bonding dielectric material is planarized by performing a mechanical grinding process and/or a chemical mechanical polishing (CMP) process. After the polishing or grinding step, a cleaning step may be optionally performed to clean and remove the residues generated from the grinding or polishing step. In some embodiments, through performing a CMP process, a good planarization degree is achieved for the first bonding dielectric layer 144 and the first TSVs 122. In some alternative embodiments, the first TSVs 122 may be slightly grinded or polished during the planarization process performed to the bonding dielectric material.

Due to the recessing process, the top surfaces 122a of the first TSVs 122 are higher than the top surface 142a of the dielectric material wrap 142. After the planarization process performed to the bonding dielectric material, as shown in FIG. 1E, the top surfaces 122a of the first TSVs 122 are exposed, while the top surface 142a of the dielectric material wrap 142 is not exposed but still covered by the first bonding dielectric layer 144. That is, the dielectric material wrap 142 is protected by the first bonding dielectric layer 144. As shown in FIG. 1E, as the planarization process is performed on a single material (i.e., the bonding dielectric material), a better planarization effect can be achieved and the top surface 144a of the first bonding dielectric layer 144 may have a high degree of planarity, which is beneficial for hybrid bonding.

As shown in FIG. 1E, through the planarization, the top surface 144a of the first bonding dielectric layer 144 becomes substantially levelled with the top surfaces 122a of the first TSVs 122. In other words, the top surface 144a of the first bonding dielectric layer 144 is coplanar with the top surfaces 122a of the first TSVs 122. In some embodiments, the first bonding dielectric layer 144 may include silicon nitride, silicon carbonitride (SiCN), silicon oxide, the like or a combination thereof. In some embodiments, due to the formation of the first bonding dielectric layer 144, there is a height difference H3 (in the thickness direction Z) between the top surface 144a of the first bonding dielectric layer 144 and the rear surface 120b of the first die 120 (or a thickness of the first bonding dielectric layer 144 directly above the first dies 120) is, for example, about 4 kA. In some embodiments, a difference between the height difference H3 and the height difference H2 is larger than or equal to about 0.5 kA. In some embodiments, the first bonding dielectric layer 144 is formed to fully cover the first dies 120 and the dielectric material wrap 142, and the planarized first bonding dielectric layer 144 is thick enough to remain covering the top surfaces of the first dies 120 and the dielectric material wrap 142. The planarized surface of the first bonding dielectric layer 144 provides a smooth surface made of a single material (i.e. the bonding dielectric material).

Figure 1F:
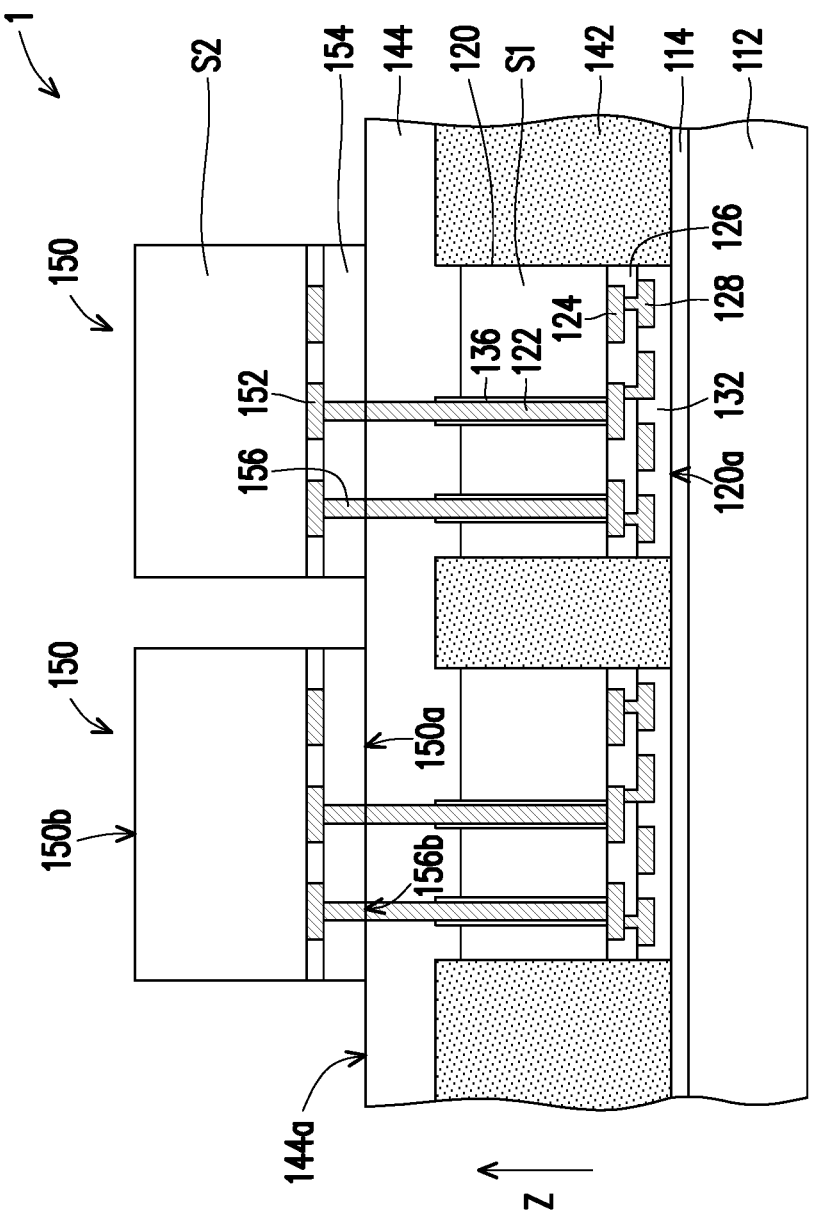

Referring to FIG. 1F, in some embodiments, at least one second die 150 is provided on the first bonding dielectric layer 144 and over the first dies 120. In some embodiments, as shown in FIG. 1F, the number of the at least one second die 150 is two. In alternative embodiments, the number of the at least one second die 150 may be one or more than two, and the disclosure is not limited thereto. The second dies 150 may be provided through a pick and place process. In some embodiments, the second dies 150 may have the same function or different functions. In some embodiments, the second die 150 includes a memory chip such as a high bandwidth memory chip, a dynamic random access memory (DRAM) chip or a static random access memory (SRAM) chip. In some alternative embodiments, the second die 150 may include an application-specific integrated circuit (ASIC) chip, an analog chip, a sensor chip, a wireless application chip such as a Bluetooth chip, and a radio frequency chip or a voltage regulator chip.

In some embodiments, each of the second dies 150 has an active surface 150a and a rear surface 150b opposite to the active surface 150a. In some embodiments, the active surface 150a faces toward the carrier 112, while the rear surface 150b faces upward. In detail, each of the second dies 150 includes a semiconductor substrate S2, conductive terminals 152, a second bonding dielectric layer 154 and metal pads 156. In some embodiments, the second bonding dielectric layer 154 and the metal pads 156 are formed on the active surface 150a of the second die 150. In some embodiments, the conductive terminals 152 are formed over the semiconductor substrate S2. The second bonding dielectric layer 154 is formed over the conductive terminals 152 and has openings that partially expose the conductive terminals 152. The metal pads 156 are then formed in the openings of the second bonding dielectric layer 154 to be electrically connected to the conductive terminals 152. In some embodiments, the metal pads 156 are embedded in the second bonding dielectric layer 154, but bottom surfaces 156b (facing toward the carrier 112) of metal pads 156 are exposed. In some embodiments, the conductive terminals 152 may be copper vias. In some embodiments, the conductive terminals 152 may be aluminum pads. In some embodiments, the metal pads 156 may be parts of a redistribution structure. In some embodiments, some of the metal pads 156 are dummy patterns which are electrically floating. In some embodiments, the second dies 150 are picked, aligned and then placed on the first dies 120. In some embodiments, the arrangement of the second dies 150 is adjusted and aligned so that the metal pads 156 of the second dies 150 are aligned with and placed directly on the first TSVs 122 of the first dies 120. As shown in FIG. 1F, the first bonding dielectric layer 144 is located between the dielectric material wrap 142 and the second bonding dielectric layer 154 and physically separates the dielectric material wrap 142 from the second bonding dielectric layer 154.

In some embodiments, the semiconductor substrate S2 may be a silicon substrate including active components (e.g., transistors or the like) and/or passive components (e.g., resistors, capacitors, inductors, or the like) formed therein. The conductive terminals 152 may be aluminum pads, copper pads, or other suitable metallic pads. In some embodiments, the second bonding dielectric layer 154 may include silicon nitride, silicon carbonitride (SiCN), silicon oxide, the like or a combination thereof. In some embodiments, the metal pads 156 may include copper, copper alloys, aluminum, aluminum alloys, tungsten, or combinations thereof.

As shown in FIG. 1F, a bonding process is performed to bond the second dies 150 to the first dies 120 through hybrid bonding, wherein the second bonding dielectric layer 154 of the second die 150 is bonded with the first bonding dielectric layer 144, and the metal pads 156 of the second die 150 are bonded with the first TSVs 122 of the first dies 120. In detail, the second bonding dielectric layer 154 and the first bonding dielectric layer 144 are bonded by dielectric-to-dielectric bonding, while the metal pads 156 and the first TSVs 122 are bonded by metal-to-metal bonding. In some embodiments, the bonding process includes a hybrid bonding process performed at temperature ranging from about 100 Celsius degree to about 400 Celsius degree.

As mentioned above, the top surface 144a of the first bonding dielectric layer 144 may have a high degree of planarity, thereby improving the robustness of the bonding between the first dies 120 and the second dies 150.

Figure 2B:
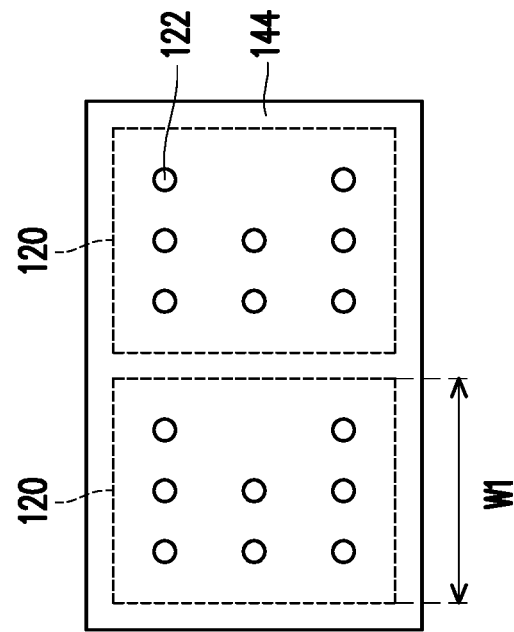
FIG. 2B is a schematic top view of first dies and a first bonding dielectric layer in FIG. 1F.
Figure 2A:
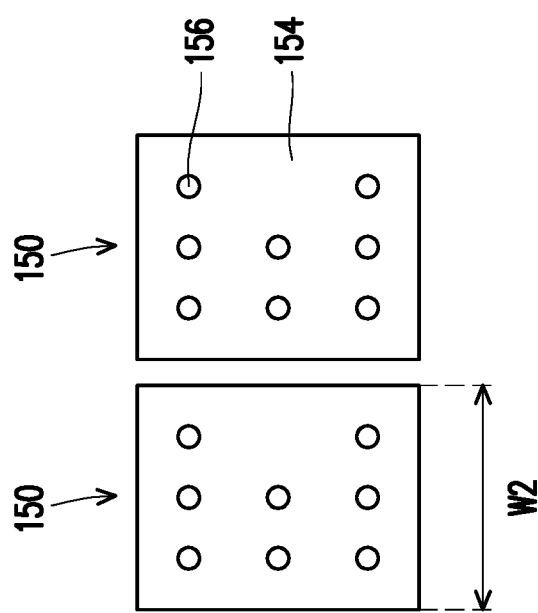
FIG. 2A is a schematic bottom view of second dies in FIG. 1F.

The exemplary bottom view of the second dies 150 is shown in FIG. 2A. The exemplary top view of the first dies 120 (indicated by dash line) and a first bonding dielectric layer 144 is shown in FIG. 2B. In some embodiments, as shown in FIG. 2A and FIG. 2B, each second die 150 corresponds to one first die 120, and positions of metal pads 156 of each second die 150 are aligned with positions of the first TSVs 122 of each first die 120. In some alternative embodiments, each second die 150 may correspond to two first dies 120 or more. In some alternative embodiments, more than one second die 150 may correspond to one first die 120. In some embodiments, the number of the first TSVs 122 is the same as the number of the metal pads 156. In some embodiments, the number of the first TSVs 122 is different from the number of the metal pads 156. In some embodiments, the size of the metal pad 156 is the same as the size of the first TSV 122. In some embodiments, the size of the metal pad 156 is larger than the size of the first TSV 122. In some embodiments, a width W1 of the first die 120 is different from a width W2 of the second die 150. In some embodiments, a width W1 of the first die 120 is the same as the width W2 of the second die 150.

Due to the configuration of the first TSVs 122 of the first dies 120 and the metal pads 156 of the second dies 150 described above, the first dies 120 are electrically connected to the second dies 150 through the first TSVs 122 and the metal pads 156.

Figure 1G:
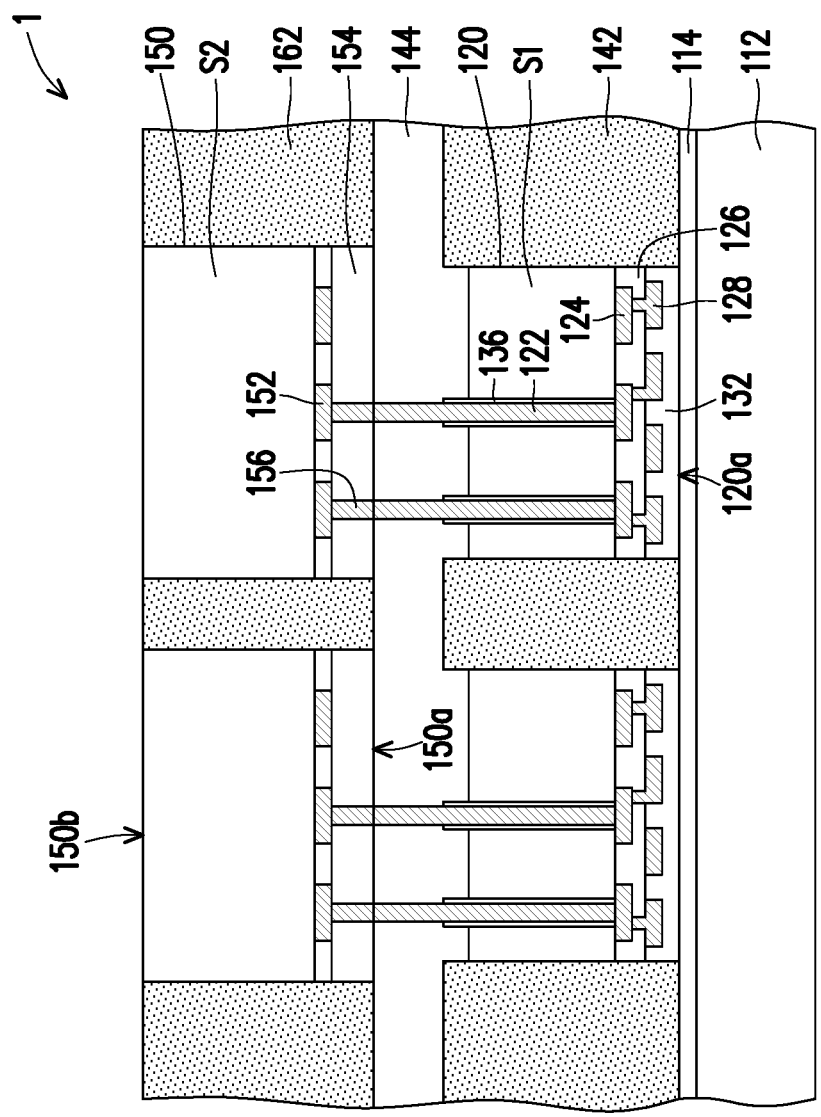

Referring to FIG. 1G, in some embodiments, after the bonding process, a dielectric material (not shown) is formed over the first bonding dielectric layer 144 and the second dies 150. In some embodiments, the dielectric material may be formed by deposition, such as CVD or the like. In some embodiments, the dielectric material covers the second dies 150, where the second dies 150 are not accessibly revealed by the dielectric material. Then, a planarization process is performed to remove the dielectric material to form a dielectric material wrap 162. In some embodiments, during the planarization process, the dielectric material is polished or grinded until the semiconductor substrates S2 of the second dies 150 are exposed. In some embodiments, the dielectric material is partially removed to form the dielectric material wrap 162 over the first bonding dielectric layer 144 and surrounding the second dies 150. In some alternative embodiments, the semiconductor substrates S2 of the second dies 150 are not exposed but covered by the dielectric material wrap 162. In some embodiments, the planarization process includes performing a mechanical grinding process, a chemical mechanical polishing (CMP) process or the combination thereof. After the polishing or grinding step, a cleaning step may be optionally performed to clean and remove the residues generated from the grinding or polishing step. However, the disclosure is not limited thereto, and the planarization process may be performed through any other suitable method.

As shown in FIG. 1G, the dielectric material wrap 162 laterally encloses the second dies 150. In some embodiments, the second dies 150 are embedded in the dielectric material wrap 162, but the rear surfaces 150b of the second dies 150 are exposed. In some embodiments, through the planarization, the rear surfaces 150b of the second dies 150 become substantially levelled with the top surface of the dielectric material wrap 162. In other words, the rear surfaces 150b of the second dies 150 are coplanar with the top surface of the dielectric material wrap 162. In some embodiments, the material of the dielectric material wrap 162 may include silicon oxide, silicon nitride, a polymeric material or a combination thereof. In some embodiments, the dielectric material wrap 162 and the dielectric material wrap 142 are made of the same material. In some embodiments, the dielectric material wrap 162 and the dielectric material wrap 142 are made of different materials.

Figure 1H:
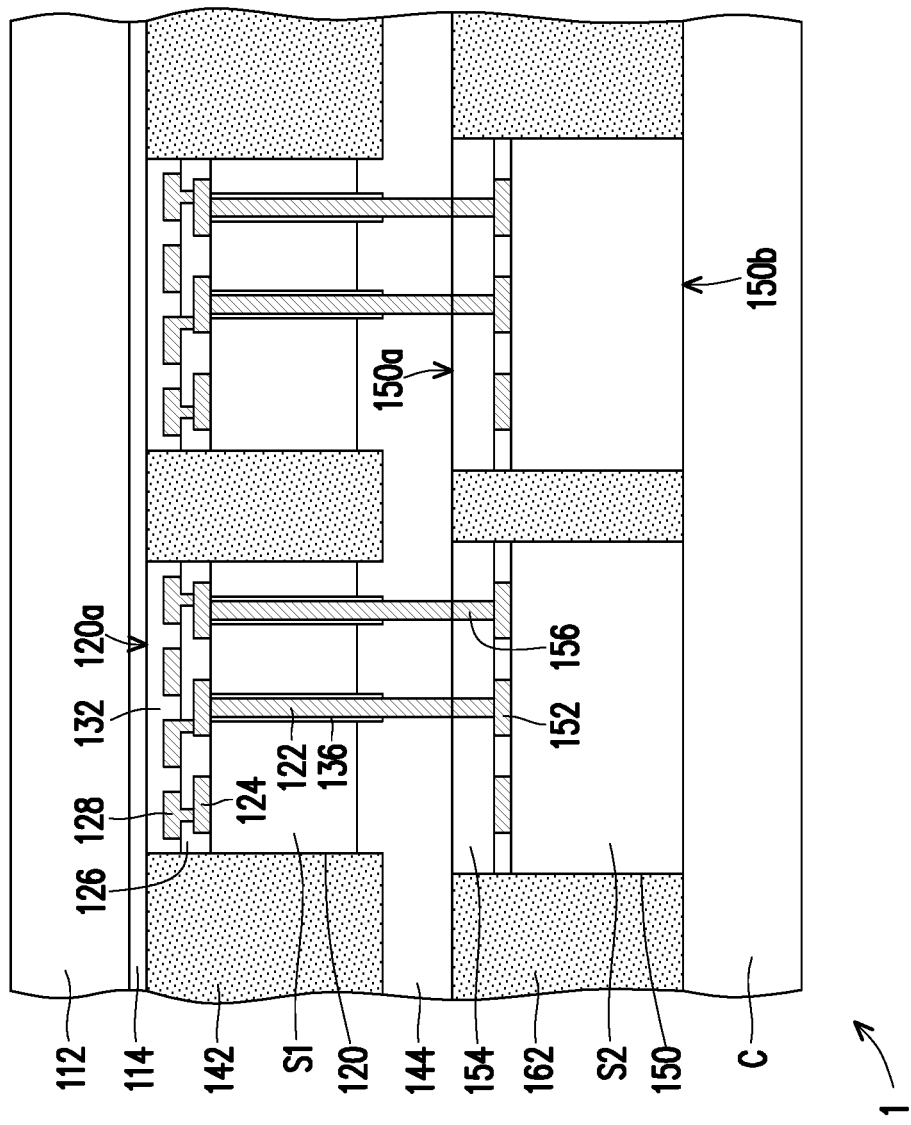

Referring to FIG. 1H, in some embodiments, the die stack structure 1 may be flipped (turned upside down) for further processing and bonded onto another carrier C. In this configuration, the carrier 112 faces upwards. In some embodiment, the carrier C may be a glass carrier or any suitable carrier for carrying a semiconductor wafer for the manufacturing method of the package.

Figure 1I:
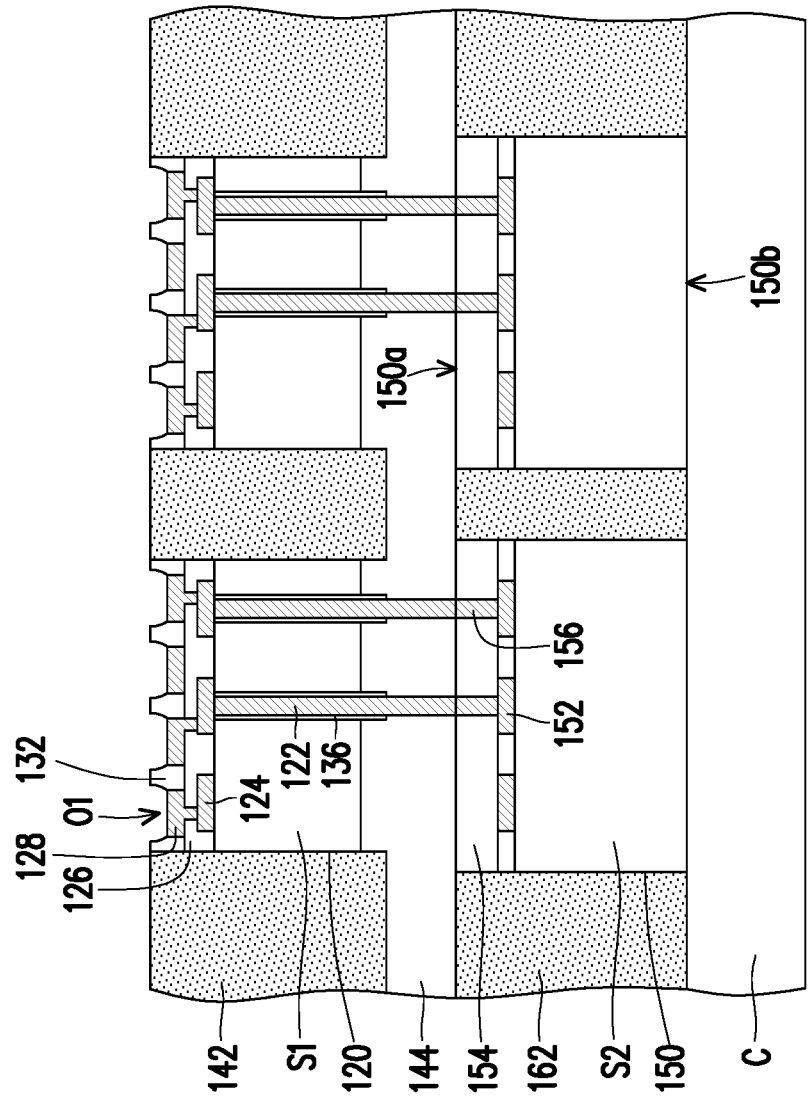

Referring to FIG. 1I, in some embodiments, the carrier 112 is removed from the buffer layer 114. In some embodiments, the carrier 112 is removed through a dry etching process or a wet etching process, and the buffer layer 114 may serve as an etching stop layer. In some alternative embodiments, the buffer layer 114 is easily separated from the carrier 112 due to a debond layer therebetween. In some embodiments, the carrier 112 is detached from the buffer layer 114 through a debonding process, where the carrier 112 and the debond layer are removed, and the buffer layer 114 is exposed. In one embodiment, the debonding process is a laser debonding process. In some embodiments, the buffer layer 114 may be subsequently removed, and a bottom surface of the dielectric material wrap 142 and the passivation layers 132 of the first dies 120 may be exposed. Alternatively, in some embodiments, the buffer layer 114 may be remained on the dielectric material wrap 142 and the first dies 120 to serve as a protection layer.

Figure 1J:
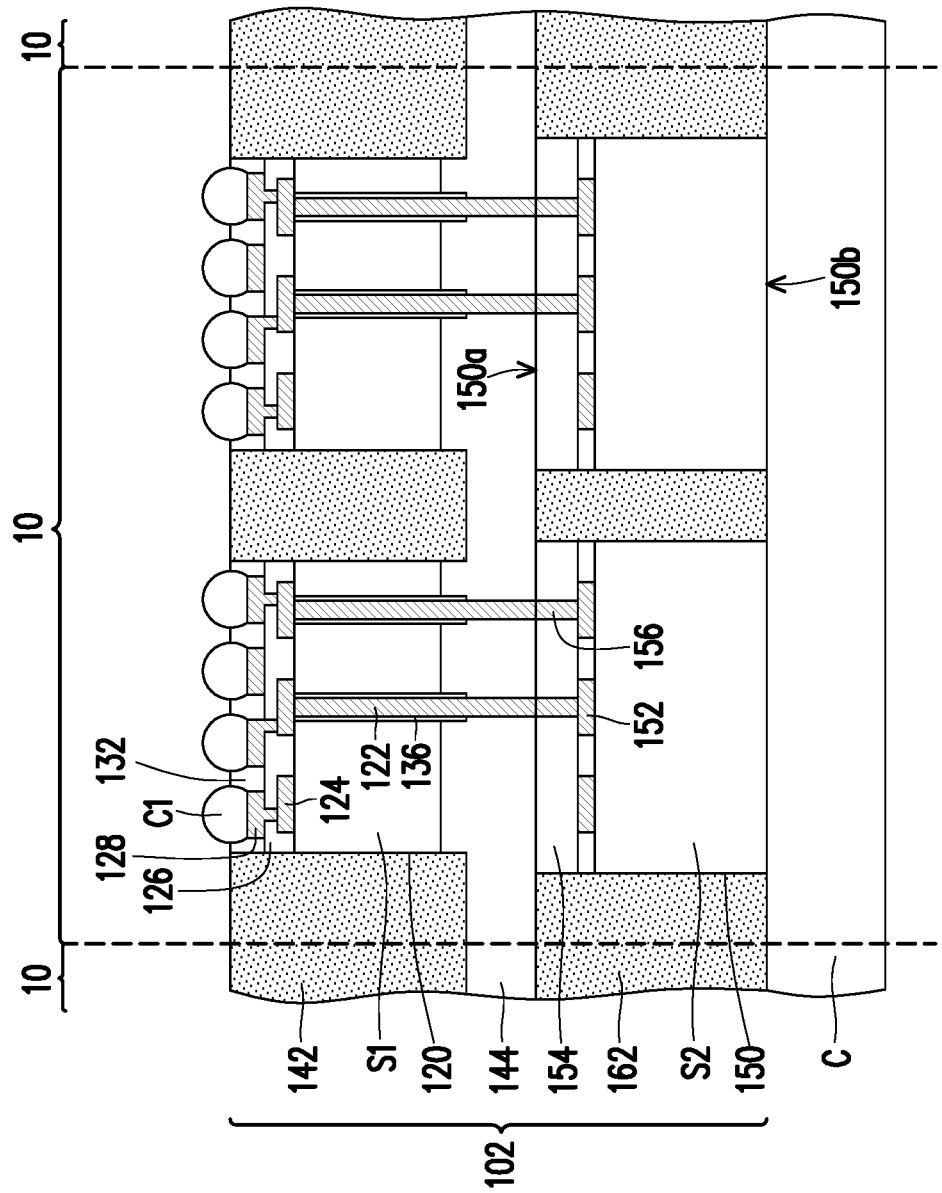

As shown in FIG. 1I, after removing the carrier 112, a plurality of openings O1 are formed in the passivation layer 132. The openings O1 at least partially expose the metal wirings 128. In some embodiments, the openings O1 are formed through a laser drilling process. In alternative embodiments, the openings O1 are formed through etching in a lithography process. Referring to FIG. 1J, in some embodiments, after the openings O1 are formed, a plurality of conductive connectors C1 are formed in the openings O1 of the passivation layer 132. In some embodiments, the conductive connectors C1 protrude from the surface of the passivation layer 132 for future electrical connection. In some embodiments, the structure overlying the carrier C is referred as a composite wafer 102. Then, a dicing process is performed on the composite wafer 102 to separate the composite wafer 102 into a plurality of packages 10. In one embodiment, the dicing process is a wafer dicing process including mechanical sawing or laser cutting.

Figure 1K:
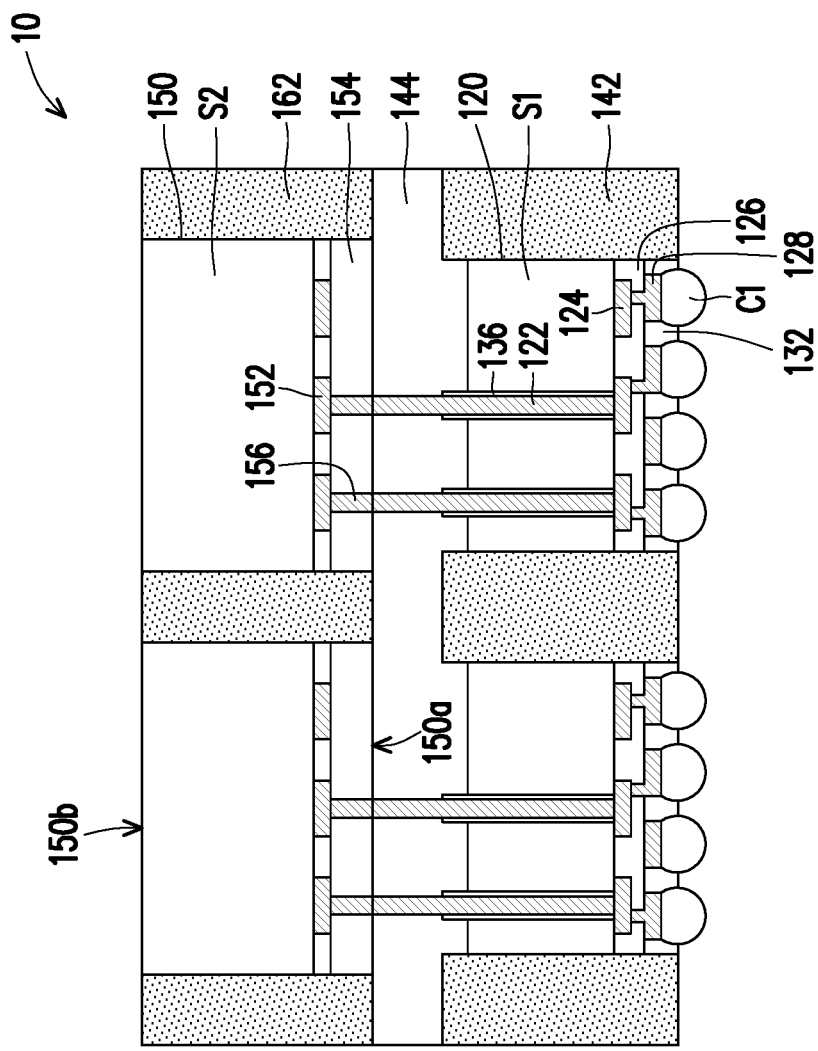

Referring to FIG. 1K, in some embodiments, after the dicing process, the packages 10 is flipped. Then, the carrier C is removed from the second dies 150 and the dielectric material wrap 162. In some embodiments, the carrier C is removed through a dry etching process or a wet etching process. In some alternative embodiments, the carrier C is detached from the second dies 150 and the dielectric material wrap 162 through a debonding process. Alternatively, in some embodiments, the carrier C may be remained on the second dies 150 and the dielectric material wrap 162. In some embodiments, the package 10 may be further mounted to a circuit substrate (such as a printed circuit board (PCB)) or mounted onto another package or sub-package unit by connecting the conductive connectors C1 to the circuit substrate, the another package or the sub-package unit.

Figure 3:
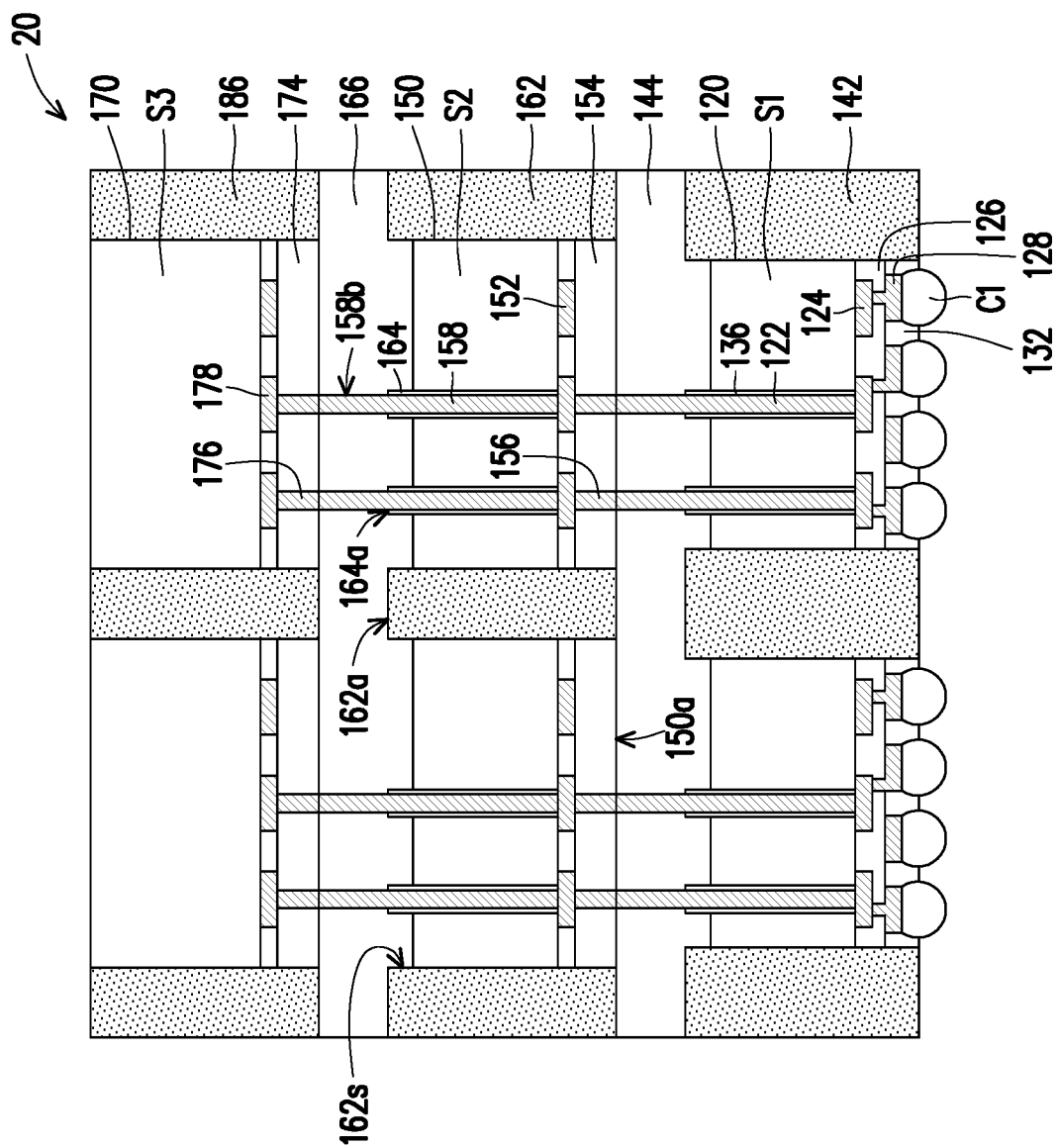
FIG. 3 is a schematic cross-sectional view of a package in accordance with some embodiments of the disclosure.

FIG. 3 is a schematic cross-sectional view of a package in accordance with some embodiments of the disclosure.

Referring to FIG. 3, the arrangement, material and forming method of the package 20 are similar to the arrangement, material and forming method of package 10 in FIG. 1K. Thus, detailed descriptions thereof are omitted here. A difference therebetween lies in that more than two layers of stacked dies are back-to-face bonded together in the package 20. The example of FIG. 3 illustrates the package 20 having three layers of stacked dies. In some alternative embodiments, four or more layers of stacked dies may be provided in the package 20.

As shown in FIG. 3, the package 20 further includes third dies 170 bonded to the second dies 150 and a dielectric material wrap 186 surrounding the third dies 170. In some embodiments, the third dies 170 and dielectric material wrap 186 may be similar to the second dies 150 and the dielectric material wrap 162 of the FIG. 1G. Each of the third dies 170 includes a semiconductor substrate S3, conductive terminals 178, a fourth bonding dielectric layer 174 and metal pads 176, and these components of the third die 170 may have configurations and materials similar to the semiconductor substrate S2, the conductive terminals 152, the second bonding dielectric layer 154 and the metal pads 156. Thus, detailed descriptions thereof are omitted here.

In addition, each of the second dies 150 further includes at least one second TSV 158 and isolation liner sheaths 164, and a third bonding dielectric layer 166 covers the rear surfaces 150b of the second dies 150, upper sidewalls 158b of the second TSVs 158, topmost ends 164a of the isolation liner sheaths 164, and the top surface 162a and portions 162s of the sidewalls of the dielectric material wrap 162. The arrangement, material and the forming method of the second TSV 158, the isolation liner sheaths 164 and the third bonding dielectric layer 166 are similar to the arrangement, material and the forming method of the first TSV 122, the recessed isolation liner sheaths 136 and the first bonding dielectric layer 144. Furthermore, the bonding method of the third dies 170 and the second dies 150 is similar to the bonding method of the second dies 150 and the first dies 120. Thus, detailed descriptions thereof are omitted here.

Due to the configuration of the second TSVs 158 of the second dies 150 and the metal pads 176 of the third dies 170 described above, the second dies 150 are electrically connected to the third dies 170 through the second TSVs 158 and the metal pads 176.

FIG. 4A to FIG. 4F are schematic cross-sectional views illustrating a manufacturing process of a die stack structure 2 and a package 30 in accordance with some embodiments of the disclosure. In exemplary embodiments, the manufacturing method is part of a wafer level packaging process. In some embodiments, one die is shown to represent plural dies of the wafer, and one die stack structure 2 is shown to represent plural die stack structures obtained following the manufacturing method.

Figure 4A:
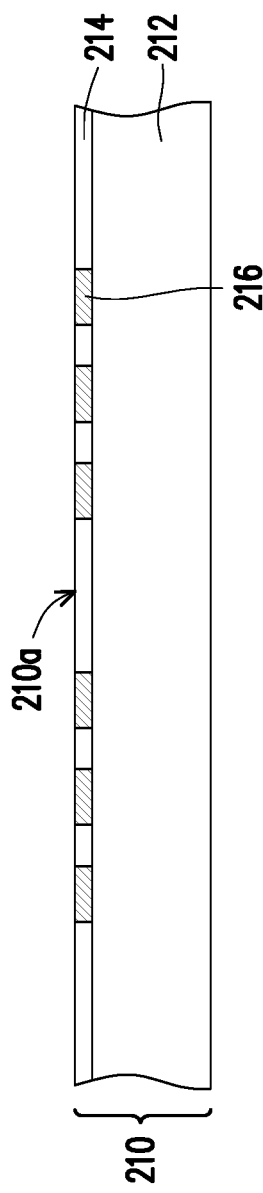
FIG. 4A to FIG. 4F are schematic cross-sectional views illustrating a manufacturing process of a die stack structure and a package in accordance with some embodiments of the disclosure.

Referring to FIG. 4A, in some embodiments, a wafer 210 having an active surface 210a facing upward is provided. In some embodiment, the wafer 210 includes a semiconductor substrate 212, a bonding dielectric layer 214 and bonding metal pads 216. In some embodiments, the bonding dielectric layer 214 and the bonding metal pads 216 are disposed on the active surface 210b of the wafer 210, wherein the bonding metal pads 216 are embedded in the bonding dielectric layer 214, but the top surfaces of the bonding metal pads 216 are exposed.

In some embodiments, the semiconductor substrate 212 may be a silicon substrate including active components (e.g., transistors or the like) and/or passive components (e.g., resistors, capacitors, inductors, or the like) formed therein. In some embodiments, the semiconductor substrate 212 may include semiconductor dies embedded therein. In some embodiments, the bonding dielectric layer 214 may include silicon nitride, silicon carbonitride (SiCN), silicon oxide, the like or a combination thereof. In some embodiments, the bonding metal pads 216 may include copper, copper alloys, aluminum, aluminum alloys, tungsten, or combinations thereof.

Figure 4B:
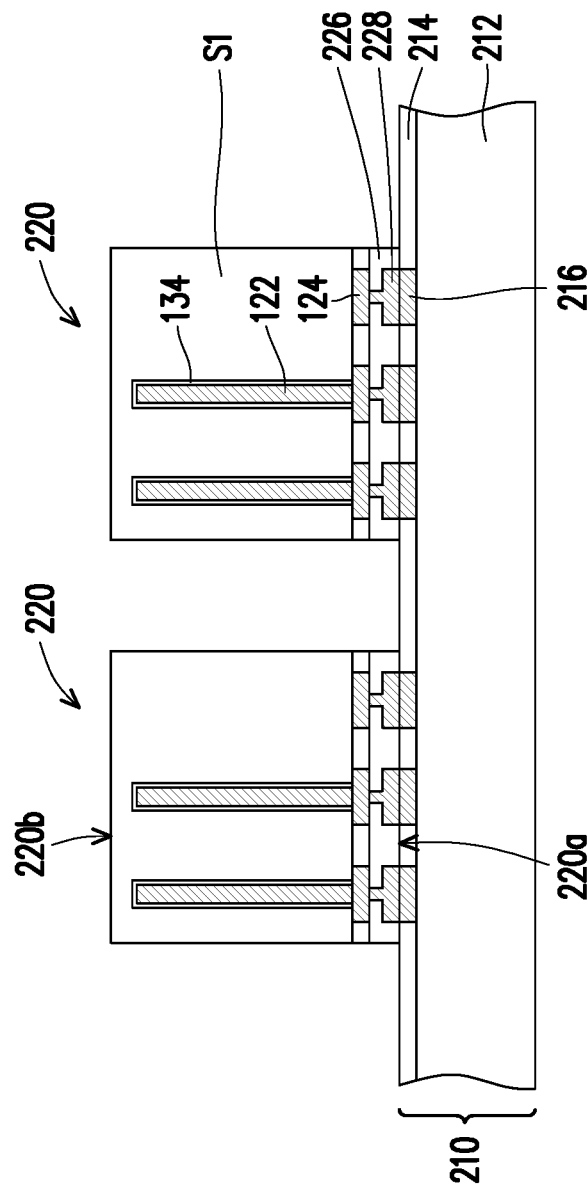

Referring to FIG. 4B, in some embodiments, at least one first die 220 is provided over the wafer 210. In some embodiments, as shown in FIG. 4B, the number of the at least one first die 220 is two. In alternative embodiments, the number of the at least one first die 220 may be one or more than two, but the disclosure is not limited thereto. In some embodiments, the first dies 220 may have the same function or different functions. In some embodiments, the first die 220 includes a memory chip such as a high bandwidth memory chip, a dynamic random access memory (DRAM) chip or a static random access memory (SRAM) chip. In some alternative embodiments, the first die 220 may include an application-specific integrated circuit (ASIC) chip, an analog chip, a sensor chip, a wireless application chip such as a Bluetooth chip, and a radio frequency chip or a voltage regulator chip.

In some embodiments, each of the first dies 220 has an active surface 220a and a rear surface 220b opposite to the active surface 220a. In some embodiments, the active surface 220a faces toward the wafer 210, while the rear surface 220b faces upward. In detail, each of the first dies 220 includes a semiconductor substrate S1, at least one first through-substrate via (TSV) 122, isolation liner layer 134, conductive pads 124, a bonding dielectric layer 226 and bonding metal pads 228. In some embodiments, the at least one first TSV 122 is formed in the semiconductor substrate S1 before forming the conductive pads 124. In some embodiments, the conductive pads 124 are formed over the semiconductor substrate S1. The bonding dielectric layer 226 is formed over the conductive pads 124. The bonding metal pads 228 are formed in the bonding dielectric layer 226 and electrically connected to the conductive pads 124. In some embodiments, the bonding metal pads 228 are embedded in the bonding dielectric layer 226, but the bottom surfaces (facing the wafer 210) of the bonding metal pads 228 are exposed. Furthermore, the first TSV 122 and the isolation liner layer 134 of the first dies 220 are similar to the first TSV 122 and the isolation liner layer 134 of the first dies 120 of FIG. 1B. Thus, detailed descriptions thereof are omitted here.

As shown in FIG. 4B, in some embodiments, a bonding process is performed to bond the first dies 220 to the wafer 210 through hybrid bonding, wherein the bonding dielectric layers 226 of the first dies 220 are bonded with the bonding dielectric layer 214 of the wafer 210, and the bonding metal pads 228 of the first dies 220 are bonded with the bonding metal pads 216 of the wafer 210. In detail, the bonding dielectric layers 226 and the bonding dielectric layer 214 are bonded by dielectric-to-dielectric bonding, while the bonding metal pads 228 and the bonding metal pads 216 are bonded by metal-to-metal bonding. In some embodiments, the bonding process includes a hybrid bonding process performed at temperature ranging from about 100 Celsius degree to about 400 Celsius degree. In some embodiments, the number of the bonding metal pads 228 is the same as the number of the bonding metal pads 216.

The following steps of the manufacturing process of the die stack structure 2 are similar to intermediate steps of manufacturing process of the die stack structure 1 as illustrated in FIG. 1C to FIG. 1G. Thus, detailed descriptions thereof are omitted here.

Figure 4C:
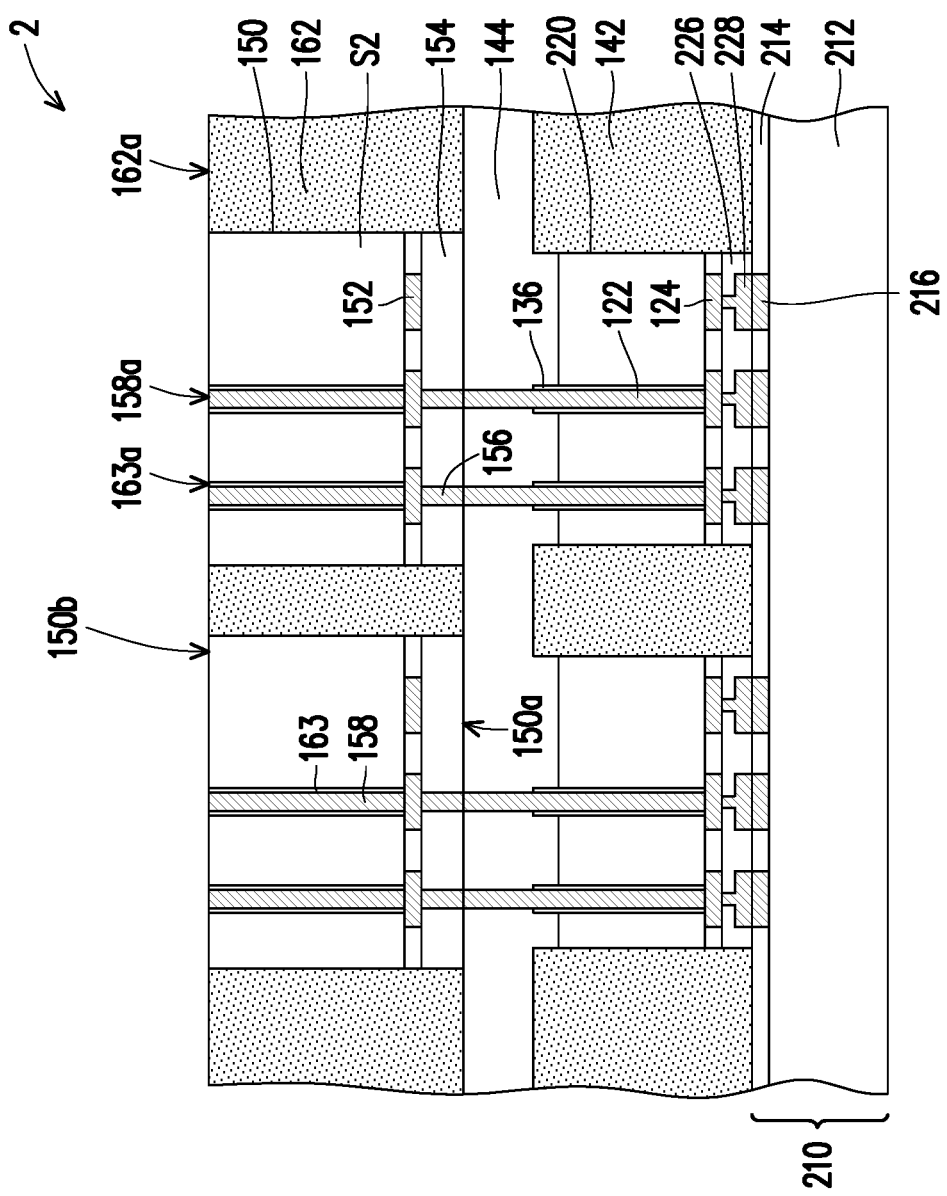

Referring to FIG. 4C, in some embodiments, a difference between the die stack structure 2 and die stack structure 1 further lies in that each of the second dies 150 further includes at least one second TSV 158 and isolation liner sheaths 163. In some embodiments, top surfaces 158a of the second TSVs 158 and topmost ends 163a of the isolation liner sheaths 163 of the second dies 150 are coplanar with the rear surfaces 150b of the second dies 150 and the top surface 162a of the dielectric material wrap 162.

Figure 4D:
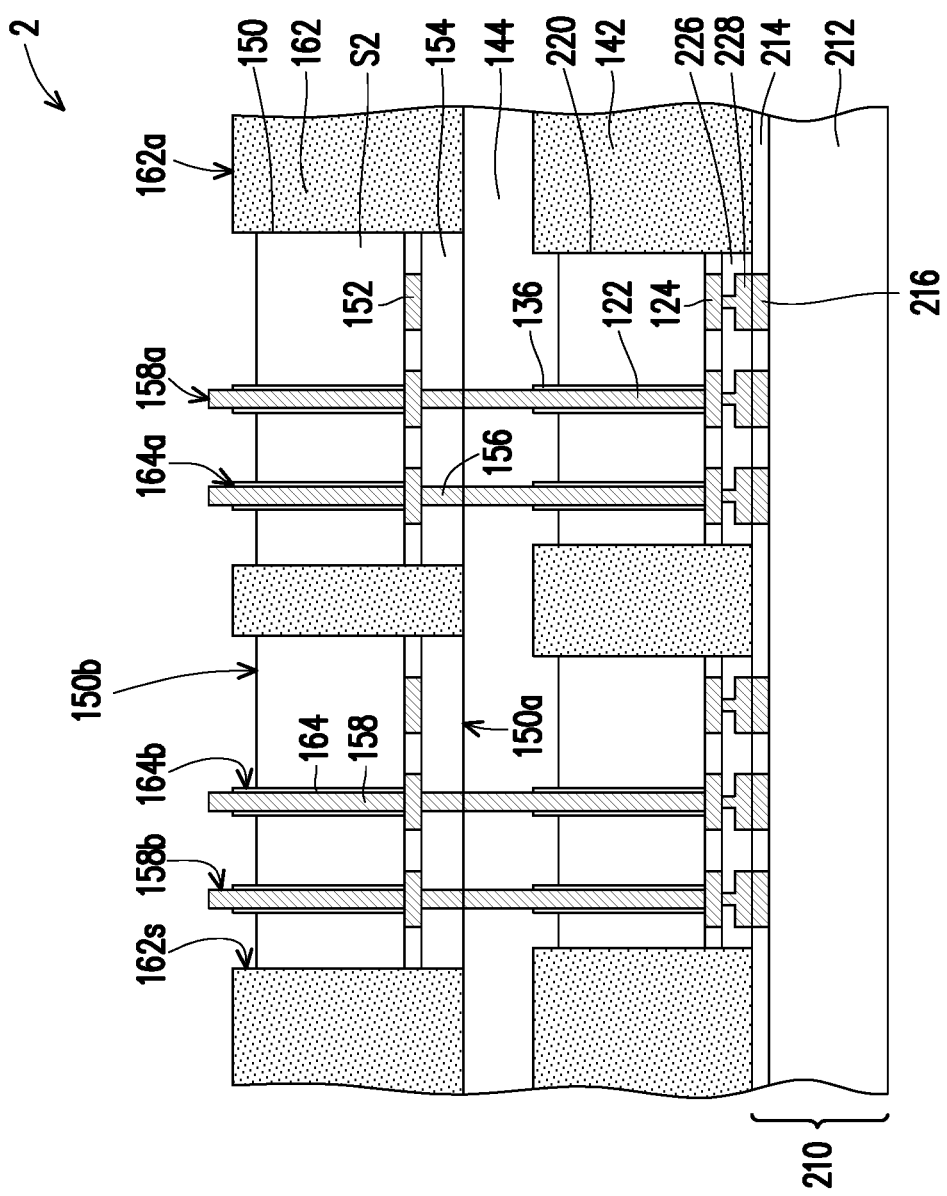

Referring to FIG. 4D, in some embodiments, a recessing process is performed to remove portions of the semiconductor substrates S2 of the second dies 150 and a portion of the dielectric material wrap 162, such that top surfaces 158a and upper sidewalls 158b of the second TSVs 158 are exposed. In other words, the second TSVs 158 penetrates through the semiconductor substrate S2, protrudes from the rear surface 150b of the second die 150 and is projected to be higher than the top surface 162a of the dielectric material wrap 162. In some embodiments, the semiconductor substrates S2 and the dielectric material wrap 162 are recessed by performing a dry etching process. In some embodiments, the semiconductor substrates S2 and the dielectric material wrap 162 are recessed by the same dry etching process, while the second TSVs 158 are not recessed by the same dry etching process. In some embodiments, in the same dry etching process, the isolation liner sheaths 163 are recessed along with the dielectric material wrap 162, while the second TSVs 158 are not recessed by the same dry etching process.

In some embodiments, in the same etching process, the etching rate (removal rate) of the semiconductor substrates S2 is higher than the etching rate (removal rate) of the dielectric material wrap 162, so that the semiconductor substrates S2 are recessed more than the dielectric material wrap 162. That is, the top surface 162a of the dielectric material wrap 162 is higher than the rear surfaces 150b of the second dies 150, and certain portions 162s of sidewalls of the dielectric material wrap 162 are exposed. In some embodiments, after performing the recessing process, the rear surfaces 150b of the second dies 150 are lower than the top surface 162a of the dielectric material wrap 162 due to etching selectivity. The height difference may be changed depending on the materials of the dielectric material wrap and the isolation liner sheath and applied etching process parameters or recipes, and the disclosure is not limited to the exemplary embodiments herein.

As shown in FIG. 4D, after performing the recessing process, portions of the isolation liner sheaths 163 are also removed to form the recessed isolation liner sheaths 164. That is, the sidewall of the second TSV 158 is not fully covered by the recessed isolation liner sheath 164. In some embodiments, the isolation liner sheath 163 and the dielectric material wrap 162 are made of the same material. In some embodiments, in the same etching process, the etching rate (removal rate) of the isolation liner sheaths 163 is about the same as the etching rate (removal rate) of the dielectric material wrap 162, so that the dielectric material wrap 162 and the isolation liner sheath 163 are recessed with the same depth. In one embodiment, topmost ends 164a of the recessed isolation liner sheaths 164 are substantially levelled with the top surface 162a of the dielectric material wrap 162 after the recessing process.

In some alternative embodiments, the isolation liner sheaths 163 and the dielectric material wrap 162 are made of different materials. In one embodiment, the recessed isolation liner sheaths 164 are still protruded from the semiconductor substrate S2 but slightly lower or higher than the top surface 162a of the dielectric material wrap 162 after the recessing process.

Figure 4E:
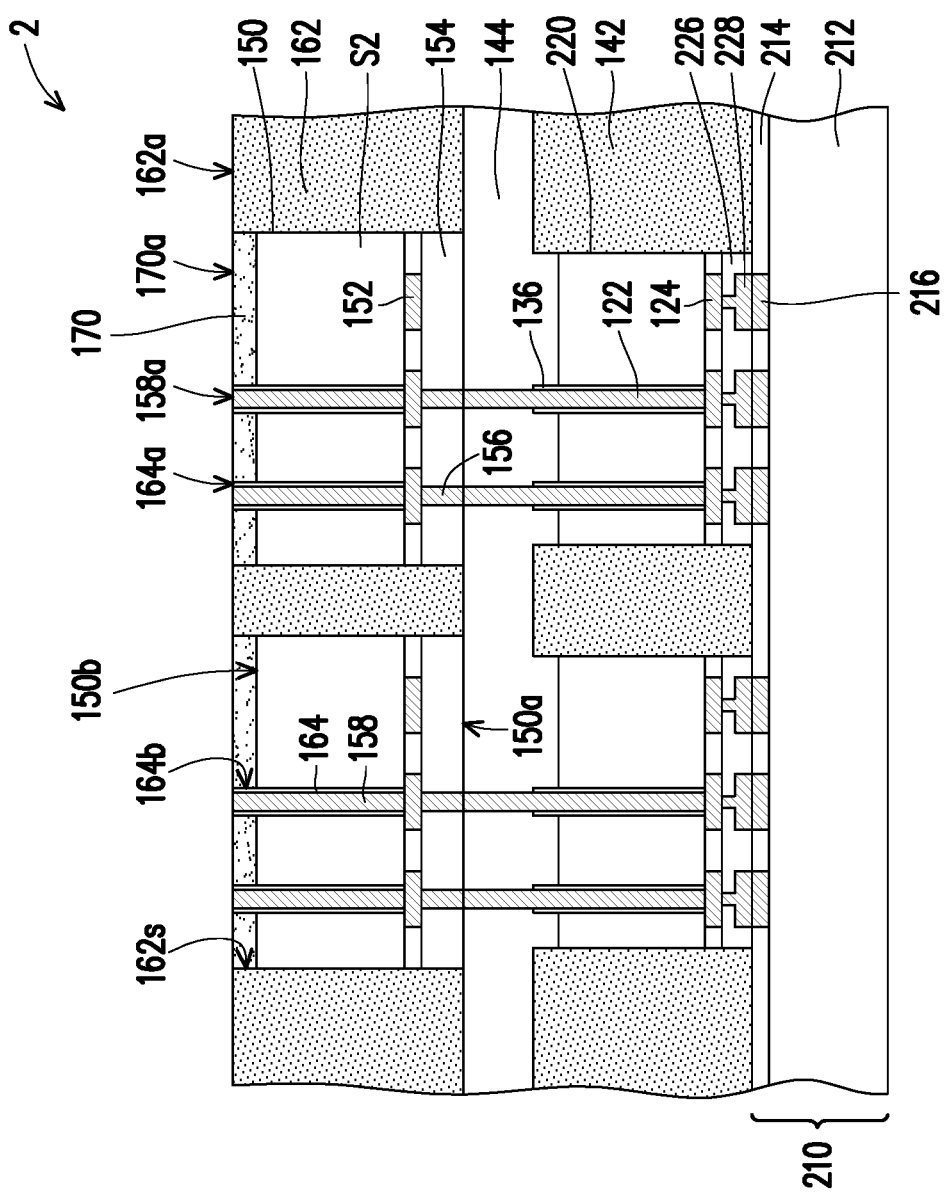

Referring to FIG. 4E, in some embodiments, isolation layer 170 is formed to cover the rear surfaces 150b of the second dies 150, so as to separate the semiconductor substrates S2 of the second dies 150 form the later-formed overlying redistribution layer (RDL). In some embodiments, an isolation dielectric material (not shown) is formed over the rear surfaces 150b of the second dies 150 and the top surface 162a of the dielectric material wrap 162, and the isolation dielectric material may be formed by deposition, such as CVD or the like. Then, a planarization process is performed to planarize the isolation dielectric material to form the isolation layer 170. In some embodiments, the isolation dielectric material and the second TSVs 158 are partially removed through polishing or grinding until the top surfaces 158a of the second TSVs 158 are coplanar with the dielectric material wrap 162. After the planarization process, the isolation layer 170 covers the rear surfaces 150b of the second dies 150, the portions 162s of sidewalls of the dielectric material wrap 162 and upper sidewalls 164b of the recessed isolation liner sheaths 164. In some embodiments, the isolation dielectric material is planarized by performing a mechanical grinding process and/or a chemical mechanical polishing (CMP) process. After the polishing or grinding step, a cleaning step may be optionally performed to clean and remove the residues generated from the grinding or polishing step. In some alternative embodiments, the recessed isolation liner sheaths 164 and the dielectric material wrap 162 may be slightly grinded or polished during the planarization process performed to the isolation dielectric material. In some embodiments, a top surface 170a the solation layer 170 is substantially levelled with the topmost ends 164a of the recessed isolation liner sheaths 164, the top surfaces 158a of the second TSVs 158 and the top surface 162a of the dielectric material wrap 162 after the planarization process.

In some embodiments, the isolation layer 170 may be made of inorganic materials, such as silicon oxide, silicon nitride, silicon oxynitride, or any suitable dielectric material. In some alternative embodiments, the isolation layer 170 may be made of organic materials, such as polybenzoxazole (PBO), polyimide (PI) or other suitable polymers.

Figure 4F:
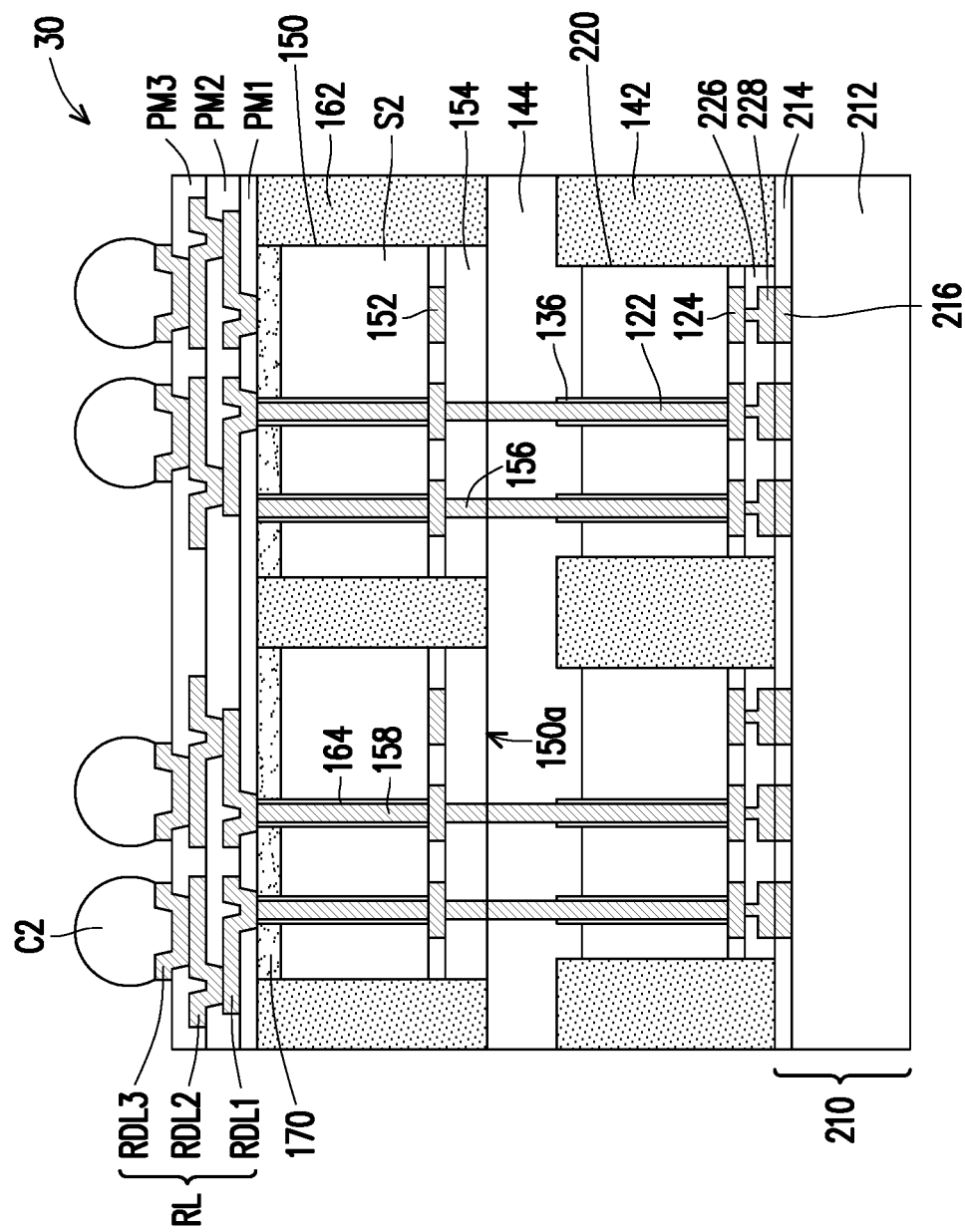

Referring to FIG. 4F, in some embodiments, a redistribution layer (RDL) structure RL is formed over and electrically connected to the die stack structure 2. In some embodiments, the RDL structure RL includes a plurality of polymer layers PM1, PM2 and PM3 and a plurality of redistribution layers RDL1, RDL2 and RDL3 and stacked alternately. The number of the polymer layers or the redistribution layers is not limited by the disclosure.

As shown in FIG. 4F, the polymer layer PM1 is formed on the second dies 150, the isolation layer 170 and the dielectric material wrap 162. The redistribution layer RDL1 is formed on the polymer layer PM1 and penetrates through the polymer layer PM1 to be electrically connected to the second TSVs 158 of the second dies 150. The polymer layer PM2 is formed on the polymer layer PM1 and the redistribution layer RDL1. The redistribution layer RDL2 is formed on the polymer layer PM2 and penetrates through the polymer layer PM2 to be electrically connected to the redistribution layer RDL1. The polymer layer PM3 is formed on the polymer layer PM2 and the redistribution layer RDL2. The redistribution layer RDL3 is formed on the polymer layer PM3 and penetrates through the polymer layer PM3 to be electrically connected to the redistribution layer RDL2.

In some embodiments, each of the polymer layers PM1, PM2 and PM3 includes a photo-sensitive material such as polybenzoxazole (PBO), polyimide (PI), benzocyclobutene (BCB), a combination thereof or the like. In some embodiments, each of the redistribution layers RDL1, RDL2 and RDL3 includes conductive materials, such as copper, nickel, titanium, a combination thereof or the like, and is formed by an electroplating process. In some embodiments, the redistribution layers RDL1, RDL2 and RDL3 respectively include a seed layer (not shown). In some embodiments, the seed layer may be a metal seed layer such as a copper seed layer. In some embodiments, the seed layer may include a first metal layer such as a titanium layer and a second metal layer such as a copper layer over the first metal layer. In some embodiments, the redistribution layers RDL1, RDL1 and RDL3 respectively include a plurality of vias and a plurality of traces connected to each other. The vias connects the redistribution layers RDL1, RDL1 and RDL3, and the traces are respectively located on the polymer layers PM1, PM2 and PM3, and respectively extend on the top surfaces of the polymer layers PM1, PM2 and PM3. In some embodiments, the topmost redistribution layer RDL3 is also referred as under-ball metallurgy (UBM) layer for ball mounting.

As shown in FIG. 4F, a plurality of conductive connectors C2 disposed on the redistribution layer RDL3 are formed. In some embodiments, the conductive connector C2 includes a conductive bump or a solder ball. In some embodiments, the conductive connectors C2 may be placed on the redistribution layer RDL3 through a ball placement process. In some embodiments, the redistribution layer RDL3 may be optional. In some embodiments, the configurations of the redistribution layer RDL3 and the conductive connectors C2 may be determined based on circuit design.

The example of FIG. 4A to FIG. 4F illustrates the package 30 having two layers of stacked dies. In some alternative embodiments, three or more layers of stacked dies may be provided in the package 30.

Figure 5:
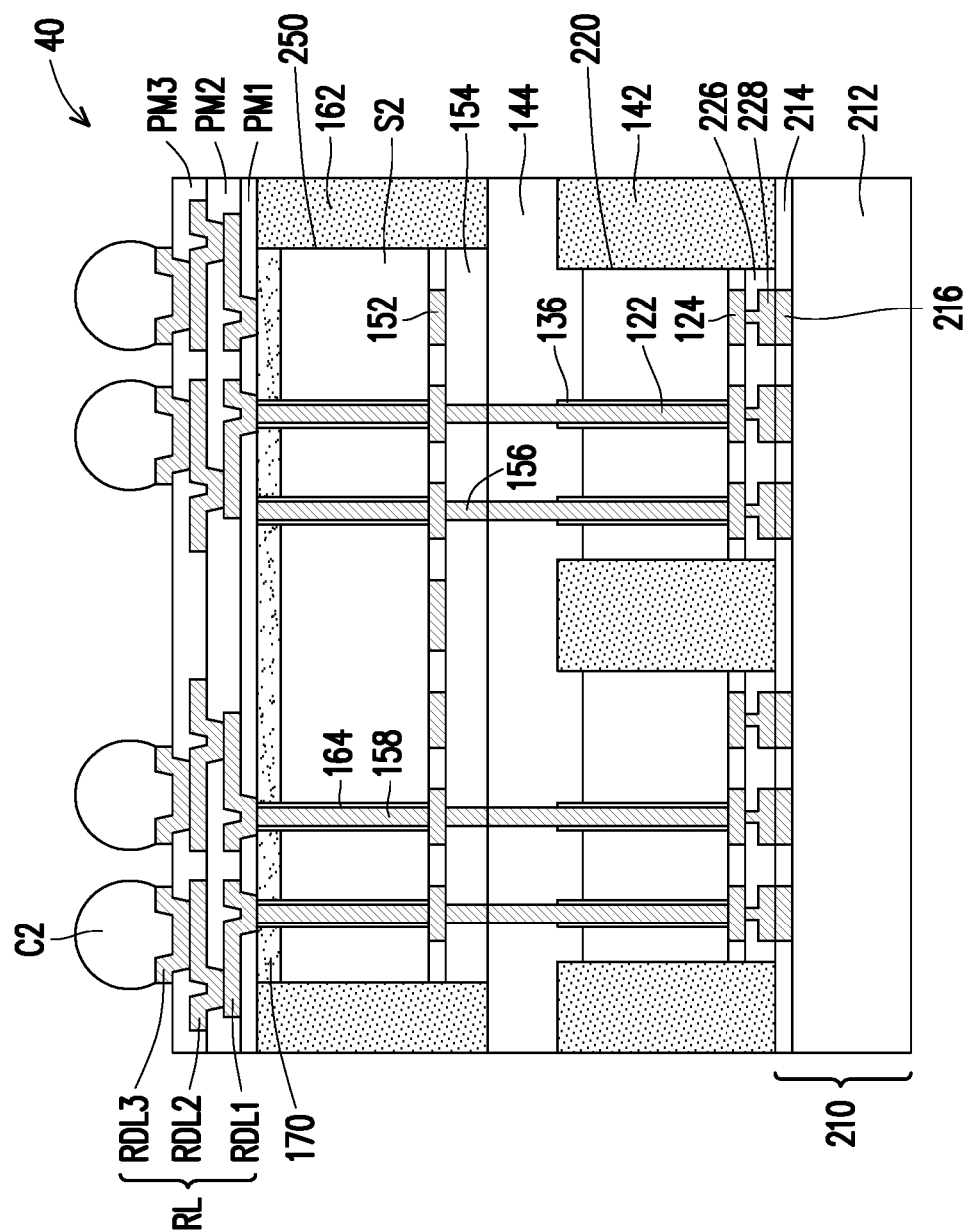
FIG. 5 is a schematic cross-sectional view of a package in accordance with some embodiments of the disclosure.
Figure 6B:
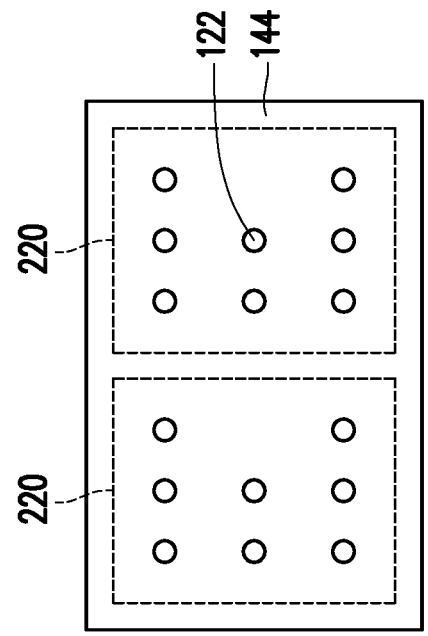
FIG. 6B is a schematic top view of first dies and a first bonding dielectric layer in FIG. 5.
Figure 6A:
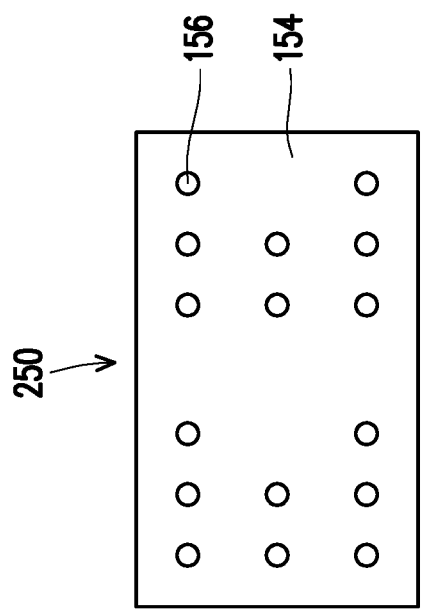
FIG. 6A is a schematic bottom view of a second die in FIG. 5.

FIG. 5 is a schematic cross-sectional view of a package 40 in accordance with some embodiments of the disclosure. FIG. 6A is a schematic bottom view of a second die 250 in FIG. 5. FIG. 6B is a schematic top view of first dies 220 and a first bonding dielectric layer 144 in FIG. 5.

Referring to FIGS. 5, 6A and 6B, the arrangement, material and forming method of the package 40 are similar to the arrangement, material and forming method of package 30 in FIG. 4F. Thus, detailed descriptions thereof are omitted here. A difference therebetween lies in that one second die 250 corresponds to two first dies 220, wherein positions of metal pads 156 of the second die 250 are aligned with positions of the first TSVs 122 of two first die 220.

The example of FIG. 5 illustrates the package 40 having two layers of stacked dies. In some alternative embodiments, three or more layers of stacked dies may be provided in the package 40.

Figure 7:
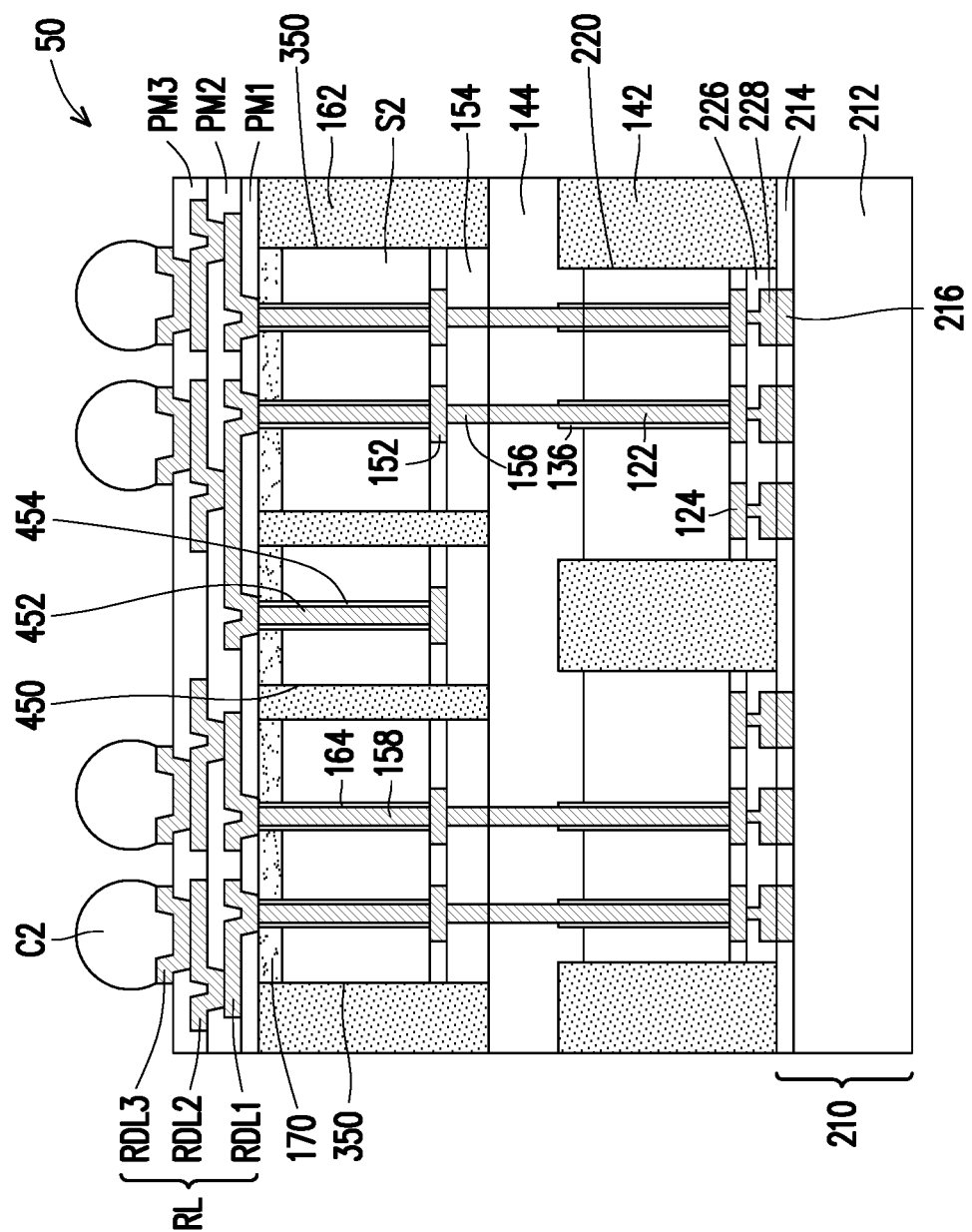
FIG. 7 is a schematic cross-sectional view of a package in accordance with some embodiments of the disclosure.
Figure 8B:
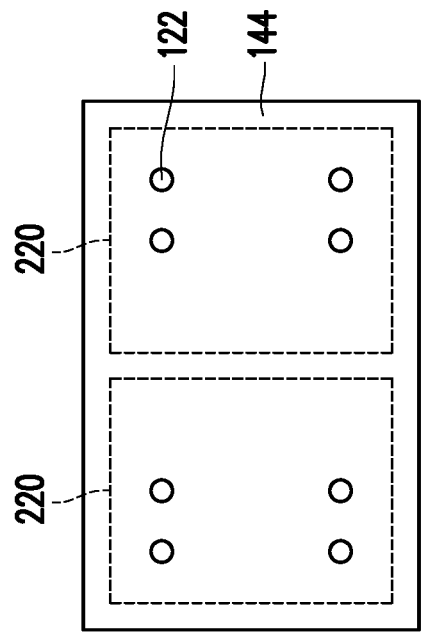
FIG. 8B is a schematic top view of first dies and a first bonding dielectric layer in FIG. 7.
Figure 8A:
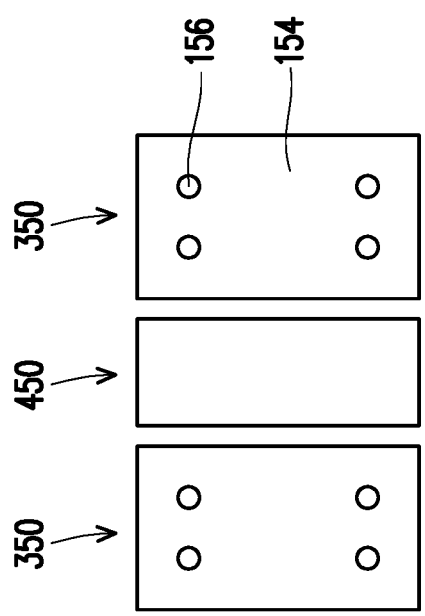
FIG. 8A is a schematic bottom view of second dies and a fourth die in FIG. 7.

FIG. 7 is a schematic cross-sectional view of a package 50 in accordance with some embodiments of the disclosure. FIG. 8A is a schematic bottom view of second dies 350 and a fourth die 450 in FIG. 7. FIG. 8B is a schematic top view of first dies 220 and a first bonding dielectric layer 144 in FIG. 7.

Referring to FIGS. 7, 8A and 8B, the arrangement, material and forming method of the package 50 are similar to the arrangement, material and forming method of package 30 in FIG. 4F. Thus, detailed descriptions thereof are omitted here. A difference therebetween lies in that one fourth die 450 is disposed between two second dies 350 similar to the second dies 150, wherein the fourth die 450 does not have metal pads 156 in the second bonding dielectric layer 154. In other words, the fourth die 450 is physically bonded to the first dies 220 only by dielectric-to-dielectric bonding, wherein the second bonding dielectric layer 154 of the fourth die 450 is bonded to the first bonding dielectric layer 144. The fourth die 450 is electrically connected with the above RDL structure RL through at least one TSV 452 therein. In one embodiment, the TSV 452 is surrounded by an isolation liner sheath 454. In some embodiments, the fourth die 450 may be electrically connected to other electrical component (not shown, such as chip, PCB and so on) via the TSV 452 of the fourth die 450 and the overlying redistribution layer structure RL. In alternative embodiments, the fourth die 450 may be a dummy die and is electrically isolated.

The example of FIG. 7 illustrates the package 50 having two layers of stacked dies. In some alternative embodiments, three or more layers of stacked dies may be provided in the package 50.

In accordance with some embodiments of the disclosure, a die stack structure includes a first die, a dielectric material layer, a first bonding dielectric layer and a second die. The first die has an active surface and a rear surface opposite to the active surface. The first die has a through-substrate via (TSV) therein. The TSV protrudes from the rear surface of the first die. The dielectric material layer surrounds and wraps around the first die. The first bonding dielectric layer is disposed on a top surface of the dielectric material layer and the rear surface of the first die and covers the TSV, wherein the TSV penetrates through the first bonding dielectric layer. The second die is disposed on the first die and has an active surface and a rear surface opposite to the active surface. The second die has a second bonding dielectric layer and a conductive feature disposed in the second bonding dielectric layer. The first bonding dielectric layer separates the second bonding dielectric layer from the dielectric material layer, and the first die and the die are bonded through bonding the second bonding dielectric layer with the first bonding dielectric layer and bonding the first conductive feature with the TSV.

In accordance with some embodiments of the disclosure, a die stack structure includes a first die, a first dielectric material layer, a first bonding dielectric layer and a second die. The first die has an active surface and a rear surface opposite to the active surface. The first die has a first through-substrate via (TSV) therein. The first TSV protrudes from the rear surface of the first die. The dielectric material layer surrounds and wraps around the first die. The first bonding dielectric layer is disposed on a top surface of the first dielectric material layer and the rear surface of the first die, wherein the first TSV penetrates through the first bonding dielectric material layer. The second die is disposed on the first die and has an active surface and a rear surface opposite to the active surface. The second die has a second TSV, a second bonding dielectric layer and a first conductive feature disposed in the second bonding dielectric layer, and the first conductive feature is electrically connected to the second TSV. The first bonding dielectric layer separates the second bonding dielectric layer from the first dielectric material layer, and the first die and the second die are electrically connected and are bonded through bonding the second bonding dielectric layer with the first bonding dielectric layer and bonding the first conductive feature with the first TSV.

In accordance with some embodiments of the disclosure, a method of fabricating a die stack structure includes the following steps. A first die having an active surface and a rear surface opposite to the active surface is provided, wherein the first die has a semiconductor substrate and a through-substrate via (TSV) embedded in the semiconductor substrate. A dielectric material layer surrounding and wrapping around the first die is formed. A recessing process is performed to remove a portion of the semiconductor substrate of the first die and a portion of the dielectric material layer such that a top surface and an upper sidewall of the TSV are exposed. A first bonding dielectric layer over the first die and the dielectric material layer and covering the TSV is formed. The first bonding dielectric layer planarized to expose the top surface of the TSV, wherein the top surface of the TSV is higher than the top surface of the dielectric material layer. A second die having an active surface and a rear surface opposite to the active surface is provided, wherein the second die has a second bonding dielectric layer and a conductive feature disposed in the second bonding dielectric layer. The first bonding dielectric layer is bonded with the second bonding dielectric layer, and the TSV is bonded with the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack structure, comprising:
a first die having an active surface and a rear surface opposite to the active surface, wherein the first die has a through-substrate via (TSV) therein, and the TSV protrudes from the rear surface of the first die;
a dielectric material layer, surrounding and wrapping around the first die;
a first bonding dielectric layer, disposed on a top surface of the dielectric material layer and the rear surface of the first die and covering the TSV, wherein the TSV penetrates through the first bonding dielectric layer; and
a second die, disposed on the first die and having an active surface and a rear surface opposite to the active surface, wherein the second die has a second bonding dielectric layer and a conductive feature disposed in the second bonding dielectric layer,
wherein the first bonding dielectric layer separates the second bonding dielectric layer from the dielectric material layer, and the first die and the second die are bonded through bonding the second bonding dielectric layer with the first bonding dielectric layer and bonding the conductive feature with the TSV.

2. The die stack structure of claim 1, wherein a top surface of the TSV is higher than the top surface of the dielectric material layer.

3. The die stack structure of claim 1, wherein the rear surface of the first die is lower than the top surface of the dielectric material layer.

4. The die stack structure of claim 3, wherein a first height difference between a top surface of the first bonding dielectric layer and the rear surface of the first die is larger than a second height difference between the top surface of the dielectric material layer and the rear surface of the first die.

5. The die stack structure of claim 1, wherein the first bonding dielectric layer contacts the top surface of the dielectric material layer and a portion of sidewalls of the dielectric material layer.

6. The die stack structure of claim 1, wherein the first die further comprises an isolation liner sheath surrounding and covering a sidewall of the TSV, and a topmost end of the isolation liner sheath is lower than a top surface of the TSV.

7. The die stack structure of claim 6, wherein the topmost end of the isolation liner sheath is covered by the first bonding dielectric layer.

8. A die stack structure, comprising:
a first die having an active surface and a rear surface opposite to the active surface, wherein the first die has a first through-substrate via (TSV) therein, and the first TSV protrudes from the rear surface of the first die;
a first dielectric material layer, surrounding and wrapping around the first die;
a first bonding dielectric layer, disposed on a top surface of the first dielectric material layer and the rear surface of the first die and covering the first TSV, wherein the first TSV penetrates through the first bonding dielectric layer; and
a second die, disposed on the first die and having an active surface and a rear surface opposite to the active surface, wherein the second die has a second TSV, a second bonding dielectric layer and a first conductive feature disposed in the second bonding dielectric layer, and the first conductive feature is electrically connected to the second TSV,
wherein the first bonding dielectric layer separates the second bonding dielectric layer from the first dielectric material layer, and the first die and the second die are electrically connected and are bonded through bonding the second bonding dielectric layer with the first bonding dielectric layer and bonding the first conductive feature with the first TSV.

9. The die stack structure of claim 8, wherein a top surface of the first TSV is higher than the top surface of the first dielectric material layer.

10. The die stack structure of claim 8, wherein a thickness of the first bonding dielectric layer on the first die is larger than a step height between the top surface of the first dielectric material layer and the rear surface of the first die.

11. The die stack structure of claim 8, wherein the first bonding dielectric layer contacts the top surface of the first dielectric material layer and a portion of sidewalls of the first dielectric material layer.

12. The die stack structure of claim 8, wherein the first die further comprises an isolation liner sheath surrounding and covering a sidewall of the first TSV, and a topmost end of the isolation liner sheath is lower than a top surface of the first TSV.

13. The die stack structure of claim 12, wherein the topmost end of the isolation liner sheath is covered by the first bonding dielectric layer.

14. The die stack structure of claim 8, wherein the second TSV protrudes from the rear surface of the second die, and the die stack structure further comprises:

a second dielectric material layer, surrounding and wrapping around the second die;

a third bonding dielectric layer, disposed on a top surface of the second dielectric material layer and the rear surface of the second die and covering the second TSV, wherein the second TSV penetrates through the third bonding dielectric layer; and a third die, disposed on the second die and having an active surface and a rear surface opposite to the active surface, wherein the third die has a fourth bonding dielectric layer and a second conductive feature disposed in the fourth bonding dielectric layer, wherein the third bonding dielectric layer separates the fourth bonding dielectric layer from the second dielectric material layer, and the second die and the third die are bonded through bonding the fourth bonding dielectric layer with the third bonding dielectric layer and bonding the second conductive feature with the second TSV.

* * * * *